United States Patent
Sasaki et al.

(10) Patent No.: US 11,726,598 B2
(45) Date of Patent: Aug. 15, 2023

(54) TACTILE PRESENTATION DEVICE

(71) Applicant: Shanghai Tianma Micro-Electronics Co., Ltd., Shanghai (CN)

(72) Inventors: Harue Sasaki, Kanagawa (JP); Hiroshi Haga, Kanagawa (JP); MingJi Hsu, Xiamen (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/843,065

(22) Filed: Jun. 17, 2022

(65) Prior Publication Data

US 2022/0413676 A1 Dec. 29, 2022

(30) Foreign Application Priority Data

Jun. 24, 2021 (JP) .................................. 2021-104904
Mar. 24, 2022 (JP) .................................. 2022-048664

(51) Int. Cl.
*G06F 3/041* (2006.01)
*H03K 17/96* (2006.01)

(52) U.S. Cl.
CPC ..... *G06F 3/04142* (2019.05); *H03K 17/9625* (2013.01)

(58) Field of Classification Search
CPC .................. G06F 3/04142; H03K 17/9625
See application file for complete search history.

(56) References Cited

U.S. PATENT DOCUMENTS

| 2010/0156818 A1* | 6/2010 | Burrough | G06F 3/04883 345/173 |
| 2012/0262394 A1* | 10/2012 | Sanma | G06F 3/016 345/173 |
| 2017/0371490 A1* | 12/2017 | Sugimoto | G06F 3/016 |
| 2018/0089967 A1* | 3/2018 | Sugimoto | G09B 21/004 |
| 2018/0113511 A1* | 4/2018 | Haga | G06F 3/04166 |

FOREIGN PATENT DOCUMENTS

| JP | 2012-221387 A | 11/2012 | |
| JP | 2012221387 A | * 11/2012 | ............. G06F 3/016 |

* cited by examiner

*Primary Examiner* — Towfiq Elahi
(74) *Attorney, Agent, or Firm* — Sughrue Mion, PLLC

(57) ABSTRACT

A tactile presentation device includes a movable part, a base, a guider, and one or more actuators. The movable part includes a first main surface and presents tactile to a user by being displaced in a predetermined one axial direction parallel to the first main surface.
The base supports the movable part in a displaceable manner. The guider connects the base and the movable part, and regulates a displacement direction of the movable part in the one axial direction by sliding in the one axial direction. The actuator displaces the movable part in the one axial direction from one end side of the movable part in the one axial direction. When the number of actuators is one, the actuator is located on a symmetry axis of the movable part parallel to the one axial direction.

15 Claims, 19 Drawing Sheets

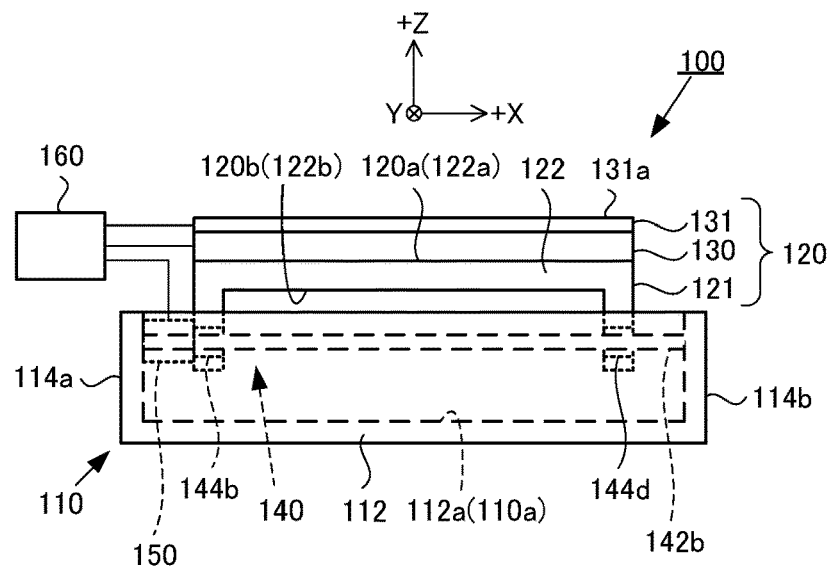
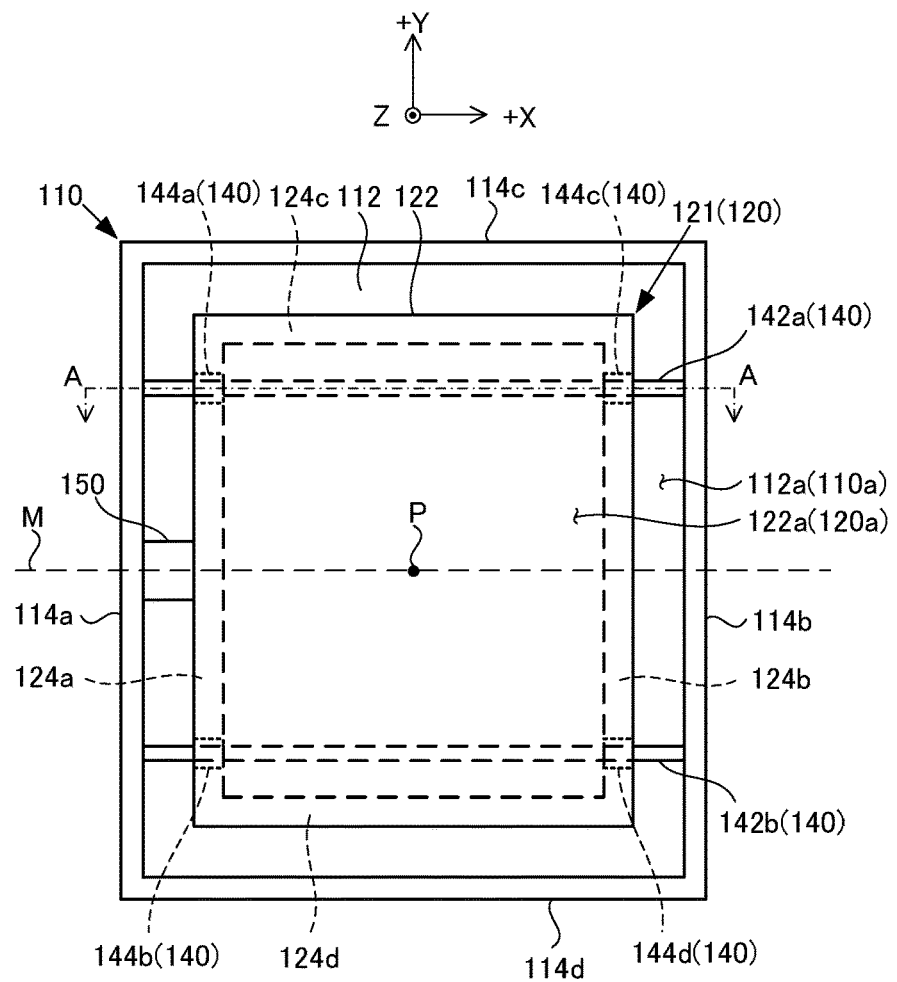

TACTILE PRESENTATION DEVICE

CROSS-REFERENCE TO RELATED APPLICATION

This application claims the benefit of Japanese Patent Application No. 2021-104904, filed on Jun. 24, 2021, and Japanese Patent Application No. 2022-48664, filed on Mar. 24, 2022, of which the entity of the disclosure is incorporated by reference herein.

FIELD

This application relates generally to a tactile presentation device.

BACKGROUND

A touch panel is known as an interface provided on a display panel for displaying characters, images, or the like and receiving user's instructions. Moreover, a technique of feeding back a tactile sensation with respect to a user's touch operation in order to improve user's operability on the touch panel is known. For example, Unexamined Japanese Patent Application Publication No. 2012-221387 discloses an operation input device including a touch operation unit having an operation surface on that input is performed by a touch operation, operation detection means that detects the touch operation, operation unit displacement means that displaces the touch operation unit, and displacement control means that controls the displacement of the touch operation unit by performing the drive control of the operation unit displacement means.

In the operation input device disclosed in Unexamined Japanese Patent Application Publication No. 2012-221387, actuators are connected to the left and right ends of a front panel integrated with a touch detector, respectively. The left and right actuators are provided in the left and right spaces of a housing, respectively. That is, the front panel integrated with the touch detector is supported by the actuators and the housing at the left and right ends.

In the operation input device disclosed in Unexamined Japanese Patent Application Publication No. 2012-221387, since the front panel is supported by the actuators and the housing at the left and right ends, the strength of the operation input device for a touch operation is weak and the operation input device may be damaged.

SUMMARY

A tactile presentation device according to a first aspect of the present disclosure includes:
a movable part that has a first main surface and presents tactile to a user by being displaced in a predetermined one axial direction parallel to the first main surface;
a base that supports the movable part in a displaceable manner;
a guider that connects the base and the movable part, and regulates a displacement direction of the movable part in the one axial direction by sliding in the one axial direction; and
one or more actuators that displace the movable part in the one axial direction from one end side of the movable part in the one axial direction, wherein
when the number of actuators is one, the actuator is located on a symmetry axis of the movable part parallel to the one axial direction,
when the number of actuators is two and the two actuators have different outputs, the two actuators are disposed at positions, where a ratio of a vertical distance between one of the actuators and the symmetry axis to a vertical distance between a remaining one of the actuators and the symmetry axis is an inverse ratio of a ratio of output of one of the actuators to output of the remaining one of the actuators, with the symmetry axis interposed between the two actuators, and
when the number of actuators is two or more and the two or more actuators have a same output, the plurality of the actuators is located symmetrically with respect to the symmetry axis.

A tactile presentation device according to a second aspect of the present disclosure includes:
a movable part that has a first main surface and presents tactile to a user by being displaced in a predetermined one axial direction parallel to the first main surface;
a base that supports the movable part in a displaceable manner;
a bush part including a rubber bush provided in the movable part or the base and a shaft portion inserted into the rubber bush to connect the movable part and the base; and
one or more actuators that displace the movable part in the one axial direction from one end side of the movable part in the one axial direction, wherein
when the number of actuators is one, the actuator is located on a symmetry axis of the movable part parallel to the one axial direction,
when the number of actuators is two and the two actuators have different outputs, the two actuators are disposed at positions, where a ratio of a vertical distance between one of the actuators and the symmetry axis to a vertical distance between a remaining one of the actuators and the symmetry axis is an inverse ratio of a ratio of output of one of the actuators to output of the remaining one of the actuators, with the symmetry axis interposed between the two actuators, and
when the number of actuators is two or more and the two or more actuators have a same output, the plurality of the actuators is located symmetrically with respect to the symmetry axis.

It is to be understood that both the foregoing general description and the following detailed description are exemplary and explanatory and are not restrictive of this disclosure.

BRIEF DESCRIPTION OF THE DRAWINGS

A more complete understanding of this application can be obtained when the following detailed description is considered in conjunction with the following drawings, in which:

FIG. 1 is a side view illustrating a tactile presentation device according to Embodiment 1;

FIG. 2 is a plan view illustrating the tactile presentation device according to Embodiment 1;

DETAILED DESCRIPTION

Figure 3:
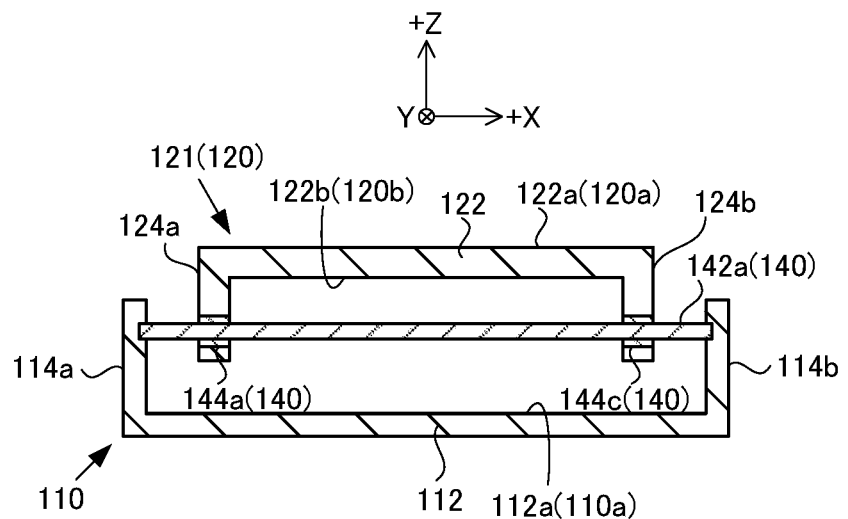
FIG. 3 is a cross-sectional view of the tactile presentation device illustrated FIG. 2 taken along line A-A.

Hereinafter, tactile presentation devices according to the embodiments are described with reference to the drawings.

Embodiment 1

A tactile presentation device 100 according to the present embodiment is described with reference to FIG. 1 to FIG. 4. The tactile presentation device 100 feeds back a tactile sensation due to vibration to a user. The tactile presentation device 100 is mounted on a smartphone, a laptop computer, a vehicle, or the like.

As illustrated in FIG. 1, the tactile presentation device 100 includes a base 110, a movable part 120, a guider 140, an actuator 150, and a controller 160. The base 110 supports the movable part 120 in a displaceable manner. The movable part 120 presents tactile to the user by being displaced in a predetermined one axial direction parallel to a first main surface 120a. The guider 140 regulates a displacement direction of the movable part 120 in the predetermined one axial direction by sliding in the predetermined one axial direction. The actuator 150 displaces the movable part 120 in the predetermined one axial direction. The controller 160 controls each component. In the present specification, in order to facilitate understanding, a right direction (right direction of the paper surface) of the tactile presentation device 100 in FIG. 1 is referred to as a +X direction, an upward direction (upward direction of the paper surface) is referred to as a +Z direction, and a direction (depth direction of the paper surface) perpendicular to the +X direction and the +Z direction is referred to as a +Y direction. Furthermore, the predetermined one axial direction is referred to as an X-axis direction.

Next, a specific configuration of the tactile presentation device 100 is described.

The base 110 of the tactile presentation device 100 supports the movable part 120 in a displaceable manner from a side of a second main surface 120b of the movable part 120 to be described below, via the guider 140. As illustrated in FIG. 2 and FIG. 3, the base 110 has a box shape that opens in the +Z direction. The base 110 includes a bottom plate 112 and four side plates 114a to 114d. The base 110 is made of, for example, a stainless steel material. FIG. 2 and FIG. 3 do not illustrate a display 130 and a touch panel 131 of the movable part 120 to be described below, in order to facilitate understanding. Also in the following drawings, the display 130 and the touch panel 131 are omitted as appropriate.

The bottom plate 112 is a flat plate having a rectangular shape. A main surface 112a of the bottom plate 112 on the +Z side corresponds to a third main surface 110a of the base 110, the third main surface 110a facing the second main surface 120b of the movable part 120 to be described below. Between the side plate 114a located on the −X side and the side plate 114b located on the +X side, shafts 142a and 142b of the guider 140 to be described below are provided.

The movable part 120 of the tactile presentation device 100 presents tactile to the user by being displaced in the X-axis direction (predetermined one axial direction). The movable part 120 is displaced in the X-axis direction by using the actuator 150 as a driving source.

As illustrated in FIG. 1, the movable part 120 includes a carrier 121, the display 130, and the touch panel 131. The carrier 121 is connected to the base 110 via the guider 140. Furthermore, the carrier 121 supports the display 130 and the touch panel 131. The display 130 displays characters, images, or the like. The touch panel 131 detects a position (touch position) where the user touches a touch surface 131a by a touch operation.

As illustrated in FIG. 2 and FIG. 3, the carrier 121 has a box shape that opens in the −Z direction. The outer shape of the carrier 121 is smaller than the inner shape of the base 110. Furthermore, the carrier 121 is located on the +Z side of the base 110 inside the base 110. The carrier 121 includes an upper plate 122 and side plates 124a to 124d. The carrier 121 is made of, for example, an aluminum alloy.

The upper plate 122 is a flat plate having a rectangular shape, and includes a first main surface 122a and a second main surface 122b opposite to the first main surface 122a. The first main surface 122a of the upper plate 122 is parallel to an XY plane (X axis), is located on the +Z side, and corresponds to the first main surface 120a of the movable part 120. The second main surface 122b of the upper plate 122 is located on the −Z side, and corresponds to the second main surface 120b of the movable part 120. The second main surface 122b of the upper plate 122 faces the third main surface 110a of the base 110. The first main surface 122a of the upper plate 122 also corresponds to a first main surface of the carrier 121, and the second main surface 122b of the upper plate 122 also corresponds to a second main surface of the carrier 121.

The side plate 124a located on the −X side is provided with bearings 144a and 144b of the guider 140 to be described below. Furthermore, the side plate 124b located on the +X side is provided with bearings 144c and 144d of the guider 140 to be described below.

The display 130 is provided on the first main surface 122a of the upper plate 122. The display 130 is, for example, a liquid crystal display panel.

The touch panel 131 is disposed on the display 130. The touch panel 131 serves as an interface that detects the touch position of the user and receives an instruction based on a touch operation of the user on the display of the display 130. The tactile presentation device 100 displaces the movable part 120 in the predetermined one axial direction (X-axis direction) according to the touch position of the user detected by the touch panel 131, and feeds back tactile due to vibration to the user by using the touch surface 131a of the touch panel 131 as a tactile presentation surface.

As illustrated in FIG. 3, the guider 140 of the tactile presentation device 100 is disposed between the second main surface 120b of the movable part 120 (the second main surface 122b of the upper plate 122 of the carrier 121) and the third main surface 110a of the base 110, and connects the base 110 and the movable part 120 (carrier 121). Moreover, the guider 140 regulates the displacement direction of the movable part 120 in the X-axis direction by sliding in the X-axis direction. As illustrated in FIG. 2, the guider 140 includes the shafts 142a and 142b and the bearings 144a to 144d.

The shafts 142a and 142b are rod-shaped members extending in the X-axis direction. The shafts 142a and 142b are made of, for example, a stainless steel material. One end of each of the shafts 142a and 142b is fixed to the side plate 114a of the base 110. The other end of each of the shafts 142a and 142b is fixed to the side plate 114b of the base 110. With this, the shafts 142a and 142b are provided between the side plate 114a and the side plate 114b. When viewed in the plan view from the +Z direction, the shafts 142a and 142b are disposed symmetrically on the +Y side and the −Y side with a symmetry axis M to be described below of the movable part 120 interposed therebetween.

The bearings 144a to 144d are, for example, sliding bearings. The bearings 144a and 144b are provided on the side plate 124a of the carrier 121. The bearings 144c and 144d are provided on the side plate 124b of the carrier 121. The bearing 144a and the bearing 144c are disposed to face each other and are inserted through the shaft 142a. Furthermore, the bearing 144b and the bearing 144d are disposed to face each other and are inserted through the shaft 142b.

In the present embodiment, the shaft 142a provided between the side plate 114a and the side plate 114b of the base 110 and extending in the X-axis direction is inserted into the bearing 144a provided on the side plate 124a of the carrier 121 and the bearing 144c provided on the side plate 124b of the carrier 121. Furthermore, the shaft 142b provided between the side plate 114a and the side plate 114b of the base 110 and extending in the X-axis direction is inserted into the bearing 144b provided on the side plate 124a of the carrier 121 and the bearing 144d provided on the side plate 124b of the carrier 121. Consequently, the shafts 142a and 142b and the bearings 144a to 144d of the guider 140 connect the base 110 and the movable part 120 (carrier 121) and the bearings 144a to 144d slide on the shafts 142a and 142b in the X-axis direction, so that it is possible to regulate the displacement direction of the movable part 120 in the X-axis direction. Since the guider 140 regulates the displacement direction of the movable part 120 in the X-axis direction, displacement of the movable part 120 in directions other than the X-axis direction is restrained and force generated by the actuator 150 is converted into the displacement (vibration) of the movable part 120 in the X-axis direction with high efficiency. Consequently, the tactile presentation device 100 can strongly vibrate the movable part 120.

Furthermore, in the present embodiment, the guider 140 that includes the shafts 142a and 142b provided between the side plate 114a and the side plate 114b of the base 110 and extending in the X-axis direction is disposed between the second main surface 120b of the movable part 120 (the second main surface 122b of the upper plate 122 of the carrier 121) and the third main surface 110a of the base 110, and connects the movable part 120 and the base 110. With this, even though the touch surface 131a of the touch panel 131 is strongly pressed by the user, the guider 140 supports the movable part 120 from the second main surface 122b side of the movable part 120, so that it is possible to increase the strength against a touch operation of the user.

The actuator 150 of the tactile presentation device 100 is a driving source that displaces the movable part 120 in the X-axis direction. The actuator 150 is disposed on one end side of the carrier 121 of the movable part 120 in the X-axis direction, and displaces the movable part 120 in the X-axis direction from one end side in the X-axis direction. In the present embodiment, as illustrated in FIG. 1, the actuator 150 is disposed between the −X side end of the carrier 121 and the side plate 114a of the base 110, and displaces the movable part 120 in the +X direction and the −X direction from the −X side.

The actuator 150 is a piezo actuator, a solenoid, a linear resonance actuator, or the like. When the actuator 150 is a piezo actuator or a solenoid, one of a stator and a mover is coupled to the −X side end of the carrier 121 and the other one of the stator and the mover is coupled to the side plate 114a of the base 110. Furthermore, when the actuator 150 is a linear resonance actuator, the actuator 150 is provided at the −X side end of the carrier 121.

Figure 4:
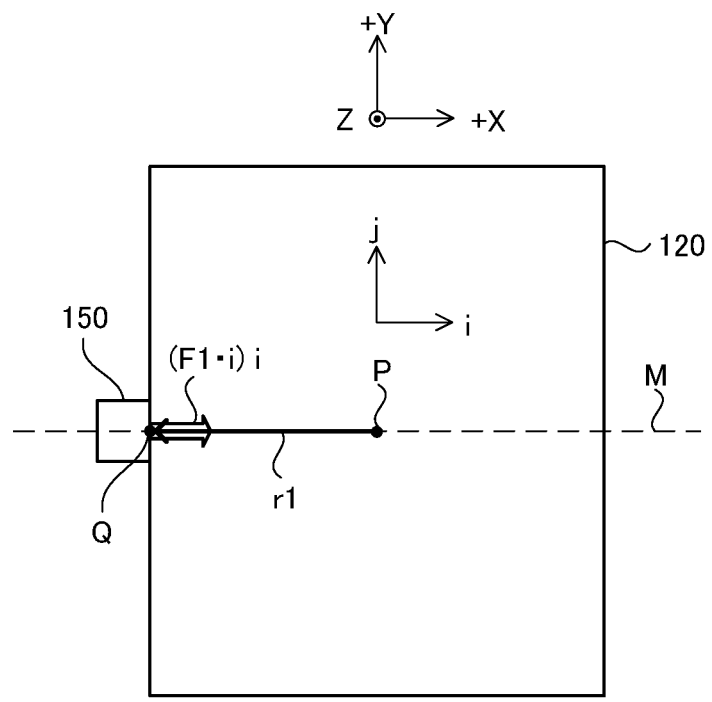
FIG. 4 is a schematic view for explaining rotational moments with respect to the center of gravity according to Embodiment 1.

Moreover, when viewed in the plan view from the +Z direction, the actuator 150 is located on the symmetry axis M of the movable part 120 parallel to the X-axis direction. As illustrated in FIG. 4, the symmetry axis M of the movable part 120 in the present embodiment is parallel to the X-axis direction and passes through the center of gravity P of the movable part 120. In such a case, when the actuator 150 applies force in the X-axis direction to the movable part 120, the sum ΣNm of rotational moments with respect to the center of gravity P in a plane parallel to the XY plane is zero as illustrated in FIG. 4 and expressed by Equation (1) to Equation (3) below. In Equation (1) to Equation (3) below, i represents a unit vector in the X-axis direction, j represents a unit vector in the Y-axis direction, F1 represents a vector of force applied to the movable part 120, and r1 represents a vector from the center of gravity P to the point of action Q of the force.

$$(r1 \cdot j)j = \begin{pmatrix} 0 \\ 0 \\ 0 \end{pmatrix} \quad (1)$$

$$(F1 \cdot i)i = \begin{pmatrix} F1 \cdot i \\ 0 \\ 0 \end{pmatrix} \quad (2)$$

$$\Sigma Nm = (r1 \cdot j)j \times (F1 \cdot i)i = \begin{pmatrix} 0 \\ 0 \\ 0 \end{pmatrix} \quad (3)$$

Consequently, the actuator 150 can convert generated force into the displacement (vibration) of the movable part 120 in the X-axis direction with high efficiency, and can strongly vibrate the movable part 120. This enables the tactile presentation device 100 to give strong vibration to the user.

The controller 160 of the tactile presentation device 100 controls display of the display 130 and obtains a touch position of the user on the touch panel 131. Furthermore, the controller 160 controls the actuator 150 according to the obtained touch position of the user, and displaces the movable part 120 in the X-axis direction. The controller 160 includes a central processing unit (CPU) for performing various processes, a read only memory (ROM) for storing programs and data, a random access memory (RAM) for storing data, and the like. The function of the controller 160 is implemented by the CPU that executes the programs stored in the ROM.

As described above, in the tactile presentation device 100, the guider 140 including the shafts 142a and 142b connects the movable part 120 and the base 110 and supports the movable part 120 from the second main surface 120b side of the movable part 120, so that it is possible to increase the strength against a touch operation of the user. Furthermore, durability against vibration of a device, a vehicle, or the like provided with the tactile presentation device 100 can be improved. Moreover, since the guider 140 regulates the displacement direction of the movable part 120 in the X-axis direction, the tactile presentation device 100 can restrain the displacement of the movable part 120 in directions other than the X-axis direction, and convert force generated by the actuator 150 into the displacement (vibration) of the movable part 120 in the X-axis direction with high efficiency. Consequently, the tactile presentation device 100 can strongly vibrate the movable part 120.

When viewed in the plan view from the +Z direction, since the actuator 150 is located on the symmetry axis M of the movable part 120 parallel to the X-axis direction, the actuator 150 can convert generated force into the displacement (vibration) of the movable part 120 in the X-axis direction with high efficiency. Consequently, the tactile presentation device 100 can strongly vibrate the movable part 120, thereby giving strong vibration to the user. Moreover, since the displacement of the movable part 120 in directions other than the X-axis direction is restrained, noise, unnecessary vibration, or the like can be suppressed.

Embodiment 2

In the tactile presentation device 100 of Embodiment 1, the shafts 142a and 142b of the guider 140 are fixed to the side plates 114a and 114b of the base 110, and the bearings 144a to 144d of the guider 140 are provided on the side plates 124a and 124b of the carrier 121. The shafts 142a and 142b of the guider 140 may be fixed to the side plates 124a and 124b of the carrier 121, and the bearings 144a to 144d of the guider 140 are provided on the side plates 114a and 114b of the base 110.

A tactile presentation device 100 of the present embodiment includes a base 110, a movable part 120, a guider 140, an actuator 150, and a controller 160, similarly to the tactile presentation device 100 of Embodiment 1.

Figure 5:
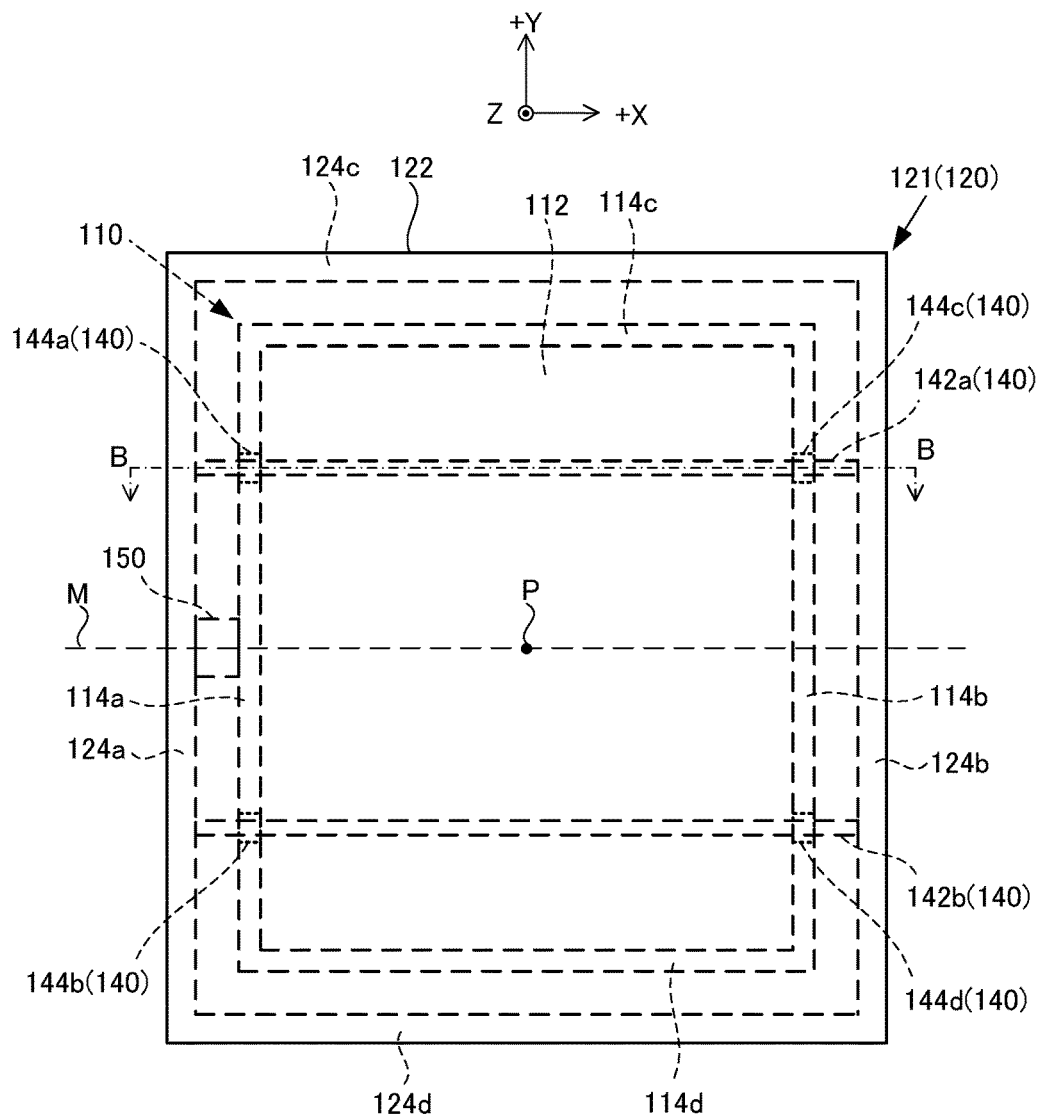
FIG. 5 is a plan view illustrating a tactile presentation device according to Embodiment 2.
Figure 6:
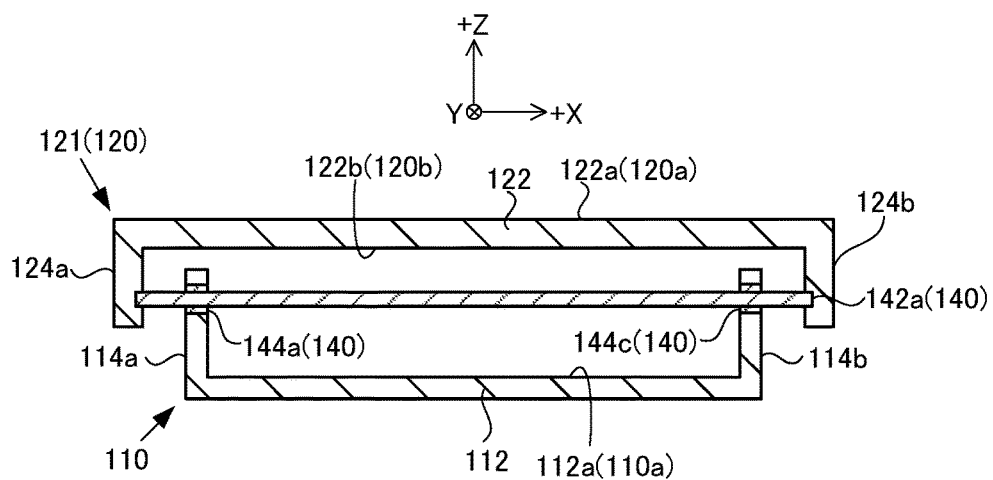
FIG. 6 is a cross-sectional view of the tactile presentation device illustrated FIG. 5 taken along line B-B.

The base 110 of the present embodiment has a box shape that opens in the +Z direction, similarly to the base 110 of Embodiment 1. Furthermore, the base 110 of the present embodiment includes a bottom plate 112 and four side plates 114a to 114d. In the present embodiment, as illustrated in FIG. 5 and FIG. 6, the outer shape of the base 110 is smaller than the inner shape of a carrier 121 of the movable part 120. The base 110 is located inside the carrier 121. Furthermore, bearings 144a and 144b of the guider 140 are provided on the side plate 114a located on the −X side. Bearings 144c and 144d of the guider 140 are provided on the side plate 114b located on the +X side. The other configurations of the base 110 of the present embodiment are the same as those of the base 110 of Embodiment 1.

The movable part 120 of the present embodiment includes a carrier 121, a display 130, and a touch panel 131, similarly to the movable part 120 of Embodiment 1. Since the configurations of the display 130 and the touch panel 131 of the present embodiment are the same as those of Embodiment 1, the carrier 121 of the present embodiment is described below.

The carrier 121 of the present embodiment has a box shape that opens in the −Z direction and includes an upper plate 122 and side plates 124a to 124d, similarly to the carrier 121 of Embodiment 1. In the present embodiment, the inner shape of the carrier 121 is larger than the outer shape of the base 110. The side plates 124a to 124d of the carrier 121 surround the base 110. Furthermore, shafts 142a and 142b of the guider 140 are provided between the side plate 124a located on the −X side and the side plate 124b located on the +X side. The other configurations of the carrier 121 of the present embodiment are the same as those of the movable part 120 of Embodiment 1.

The guider 140 of the present embodiment includes the shafts 142a and 142b and bearings 144a to 144d, similarly to the guider 140 of Embodiment 1. The shafts 142a and 142b of the present embodiment are provided between the side plate 124a and the side plate 124b of the carrier 121. Furthermore, in the present embodiment, the bearings 144a and 144b are provided on the side plate 114a of the base 110. The bearings 144c and 144d are provided on the side plate 114b of the base 110. The bearing 144a and the bearing 144c are disposed to face each other, and the shaft 142a is inserted into the bearing 144a and the bearing 144c. The bearing 144b and the bearing 144d are disposed to face each other, and the shaft 142b is inserted into the bearing 144b and the bearing 144d. The other configurations of the shafts 142a and 142b and the bearings 144a to 144d of the present embodiment are the same as those of Embodiment 1.

In the present embodiment, the shaft 142a provided between the side plate 124a and the side plate 124b of the carrier 121 and extending in the X-axis direction is inserted into the bearing 144a provided on the side plate 114a of the base 110 and the bearing 144c provided on the side plate 114b of the base 110. Furthermore, the shaft 142b provided between the side plate 124a and the side plate 124b of the carrier 121 and extending in the X-axis direction is inserted into the bearing 144b provided on the side plate 114a of the base 110 and the bearing 144d provided on the side plate 114b of the base 110.

Consequently, similarly to the guider 140 of Embodiment 1, the guider 140 of the present embodiment can connect the base 110 and the movable part 120 (carrier 121) and regulate the displacement direction of the movable part 120 in the X-axis direction. Furthermore, since the guider 140 regulates the displacement direction of the movable part 120 in the X-axis direction, the tactile presentation device 100 restrains the displacement of the movable part 120 in directions other than the X-axis direction, so that force generated by the actuator 150 is converted into the displacement (vibration) of the movable part 120 in the X-axis direction with high efficiency. Consequently, the tactile presentation device 100 can strongly vibrate the movable part 120. Moreover, the guider 140 including the shafts 142a and 142b connects the movable part 120 and the base 110, so that it is possible to increase the strength against a touch operation of the user. The guider 140 supports the movable part 120 from the second main surface 120b side of the movable part 120, so that it is possible to increase the strength against a touch operation of the user.

Similarly to the actuator 150 of Embodiment 1, the actuator 150 of the present embodiment is disposed between the −X side end of the movable part 120 and the side plate 114a of the base 110, and displaces the movable part 120 in the +X direction and the −X direction from the −X side. The other configurations of the actuator 150 of the present embodiment are also the same as those of Embodiment 1.

Similarly to the controller 160 of Embodiment 1, the controller 160 of the present embodiment controls display of the display 130 and obtains a touch position of the user on the touch panel 131. Furthermore, the controller 160 of the present embodiment controls the actuator 150 according to the obtained touch position of the user, and displaces the movable part 120 in the X-axis direction.

As described above, also in the present embodiment, the guider 140 including the shafts 142a and 142b connects the movable part 120 and the base 110, so that it is possible to increase the strength against a touch operation of the user. The guider 140 supports the movable part 120 from the second main surface 120b side of the movable part 120, so that it is possible to further increase the strength against a touch operation of the user. Furthermore, since the guider 140 regulates the displacement direction of the movable part 120 in the X-axis direction, the tactile presentation device 100 of the present embodiment can restrain the displacement of the movable part 120 in directions other than the X-axis direction, and convert force generated by the actuator 150 into the displacement (vibration) of the movable part 120 in the X-axis direction with high efficiency. Consequently, the tactile presentation device 100 can strongly vibrate the movable part 120. Moreover, similarly to the tactile presentation device 100 of Embodiment 1, when viewed in the plan view from the +Z direction, since the actuator 150 is located on the symmetry axis M of the movable part 120 parallel to the X-axis direction, the actuator 150 can convert generated force into the displacement (vibration) of the movable part 120 in the X-axis direction with high efficiency. Consequently, the tactile presentation device 100 of the present embodiment can strongly vibrate the movable part 120, thereby giving strong vibration to the user.

Embodiment 3

In the tactile presentation devices 100 of Embodiment 1 and Embodiment 2, one actuator 150 displaces the movable part 120 in the X-axis direction. The tactile presentation device 100 may include a plurality of actuators 150 having the same output. When viewed in the plan view from the +Z direction, the plurality of actuators 150 having the same output is disposed symmetrically with respect to the symmetry axis M of the movable part 120. Hereinafter, a case where the number of actuators 150 is two and a case where the number of actuators 150 is three are described. The configuration of a tactile presentation device 100 of the present embodiment is the same as the tactile presentation device 100 of Embodiment 1, except for the number of actuators 150 and the positions of the actuators 150 on one end side of the movable part 120 in the X-axis direction.

Figure 7:
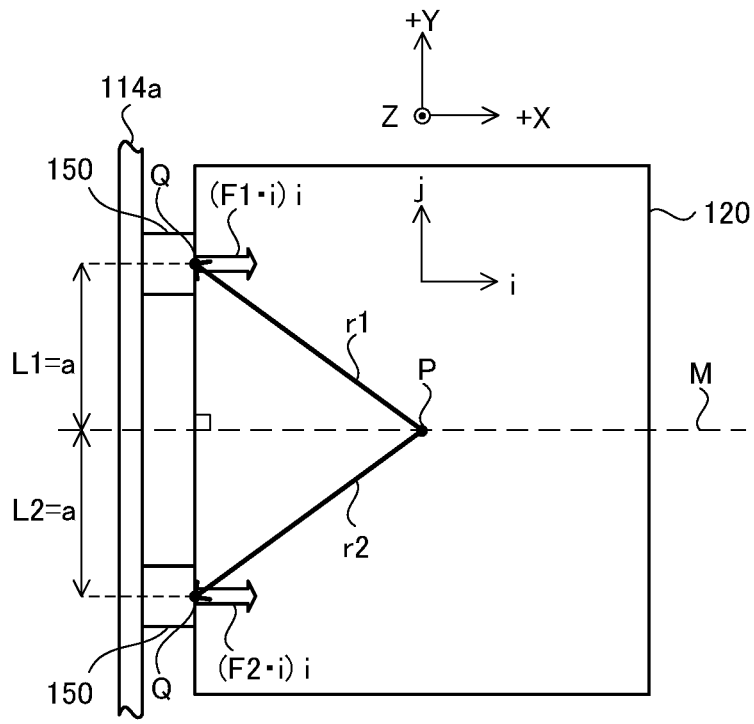
FIG. 7 is a schematic view for explaining rotational moments with respect to the center of gravity according to Embodiment 3.

In a case where the number of actuators 150 having the same output is two, the two actuators 150 are symmetrically disposed with the symmetry axis M interposed therebetween when viewed in the plan view from the +Z direction as illustrated in FIG. 7. That is, a vertical distance L1 between the actuator 150 located on the +Y side of the symmetry axis M and the symmetry axis M is equal to a vertical distance L2 between the actuator 150 located on the −Y side of the symmetry axis M and the symmetry axis M (L1=L2=a). Hereinafter, the actuator 150 located on the +Y side of the symmetry axis M is referred to as a +Y side actuator 150 and the actuator 150 located on the −Y side of the symmetry axis M is referred to as a −Y side actuator 150.

When the two actuators 150 having the same output are symmetrically disposed with the symmetry axis M interposed therebetween, the sum ΣNm of rotational moments with respect to the center of gravity P in the plane parallel to the XY plane is zero as illustrated in FIG. 7 and expressed by Equation (4) to Equation (7). In Equation (4) to Equation (7) below, i represents a unit vector in the X-axis direction and j represents a unit vector in the Y-axis direction. Furthermore, F1 represents a vector of force applied to the movable part 120 by the +Y side actuator 150, and r1 represents a vector from the center of gravity P to the point of action Q of the force applied by the +Y side actuator 150. F2 represents a vector of force applied to the movable part 120 by the −Y side actuator 150, and r2 represents a vector from the center of gravity P to the point of action Q of the force applied by the −Y side actuator 150.

$$(r1 \cdot j)j = \begin{pmatrix} 0 \\ a \\ 0 \end{pmatrix} \quad (4)$$

$$(r2 \cdot j)j = \begin{pmatrix} 0 \\ -a \\ 0 \end{pmatrix} \quad (5)$$

$$(F1 \cdot i)i = (F2 \cdot i)i = \begin{pmatrix} F1 \cdot i \\ 0 \\ 0 \end{pmatrix} \quad (6)$$

-continued $$\Sigma Nm = (r1 \cdot j) j \times (F1 \cdot i)i + (r2 \cdot j) j \times (F2 \cdot i)i = \begin{pmatrix} 0 \\ 0 \\ -a(F1 \cdot i) \end{pmatrix} + \begin{pmatrix} 0 \\ 0 \\ a(F1 \cdot i) \end{pmatrix} = \begin{pmatrix} 0 \\ 0 \\ 0 \end{pmatrix} \quad (7)$$

Consequently, when viewed in the plan view from the +Z direction, the two actuators 150 having the same output are symmetrically disposed with the symmetry axis M interposed therebetween, thereby converting generated force into the displacement (vibration) of the movable part 120 in the X-axis direction with high efficiency and strongly vibrating the movable part 120.

Figure 8:
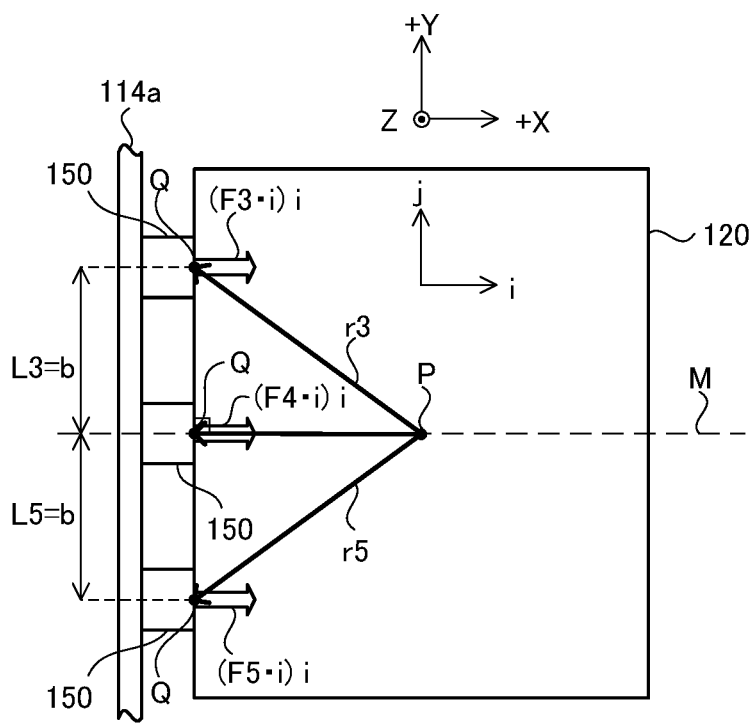
FIG. 8 is a schematic view for explaining rotational moments with respect to the center of gravity according to Embodiment 3.

In a case where the number of actuators 150 having the same output is three, the three actuators 150 are symmetrically disposed with the symmetry axis M interposed therebetween when viewed in the plan view from the +Z direction as illustrated in FIG. 8. That is, one of the three actuators 150 is disposed on the symmetry axis M, and the remaining two actuators 150 are disposed at positions, where vertical distances L3 and L5 from the symmetry axis M are equal to each other, with the symmetry axis M interposed therebetween (L3=L5=b).

When the three actuators 150 having the same output are symmetrically disposed with the symmetry axis M interposed therebetween, the sum ΣNm of rotational moments with respect to the center of gravity P in the plane parallel to the XY plane is zero as illustrated in FIG. 8 and expressed by Equation (8) to Equation (12). In Equation (8) to Equation (12) below, F3 represents a vector of force applied to the movable part 120 by the +Y side actuator 150, and r3 represents a vector from the center of gravity P to the point of action Q of the force applied by the +Y side actuator 150. F4 represents a vector of force applied to the movable part 120 by the actuator 150 disposed on the symmetry axis M, and r4 represents a vector from the center of gravity P to the point of action Q of the force applied by the actuator 150 disposed on the symmetry axis M. F5 represents a vector of force applied to the movable part 120 by the −Y side actuator 150, and r5 represents a vector from the center of gravity P to the point of action Q of the force applied by the −Y side actuator 150.

$$(r3 \cdot j)j = \begin{pmatrix} 0 \\ b \\ 0 \end{pmatrix} \quad (8)$$

$$(r4 \cdot j)j = \begin{pmatrix} 0 \\ 0 \\ 0 \end{pmatrix} \quad (9)$$

$$(r5 \cdot j)j = \begin{pmatrix} 0 \\ -b \\ 0 \end{pmatrix} \quad (10)$$

$$(F3 \cdot i)i = (F4 \cdot i)i = (F5 \cdot i)i = \begin{pmatrix} F3 \cdot i \\ 0 \\ 0 \end{pmatrix} \quad (11)$$

$$\Sigma Nm = (r3 \cdot j) j \times (F3 \cdot i)i + (r4 \cdot j) j \times (F4 \cdot i)i + (r5 \cdot j) j \times (F5 \cdot i)i = \begin{pmatrix} 0 \\ 0 \\ -b(F3 \cdot i) \end{pmatrix} + \begin{pmatrix} 0 \\ 0 \\ 0 \end{pmatrix} + \begin{pmatrix} 0 \\ 0 \\ b(F3 \cdot i) \end{pmatrix} = \begin{pmatrix} 0 \\ 0 \\ 0 \end{pmatrix} \quad (12)$$

Consequently, the three actuators 150 having the same output are symmetrically disposed with the symmetry axis M interposed therebetween, thereby converting generated force into the displacement (vibration) of the movable part 120 in the X-axis direction with high efficiency and strongly vibrating the movable part 120, similarly to the case where the number of actuators 150 having the same output is two.

As described above, when viewed in the plan view from the +Z direction, a plurality of actuators 150 having the same output is disposed symmetrically with respect to the symmetry axis M of the movable part 120, so that generated force can be converted into the displacement (vibration) of the movable part 120 in the X-axis direction with high efficiency and the actuators 150 can strongly vibrate the movable part 120. Consequently, the tactile presentation device 100 of the present embodiment can give strong vibration to the user.

Embodiment 4

In Embodiment 1 to Embodiment 3, the base 110 and the movable part 120 are connected by the guider 140 including the shafts 142a and 142b and the bearings 144a to 144d. The base 110 and the movable part 120 may be connected by rubber bushes 172.

Figure 9:
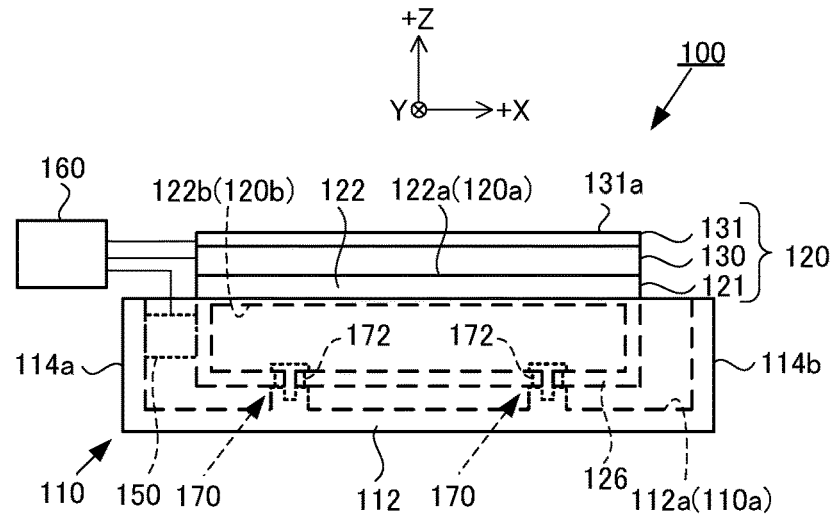
FIG. 9 is a side view illustrating a tactile presentation device according to Embodiment 4.
Figure 10:
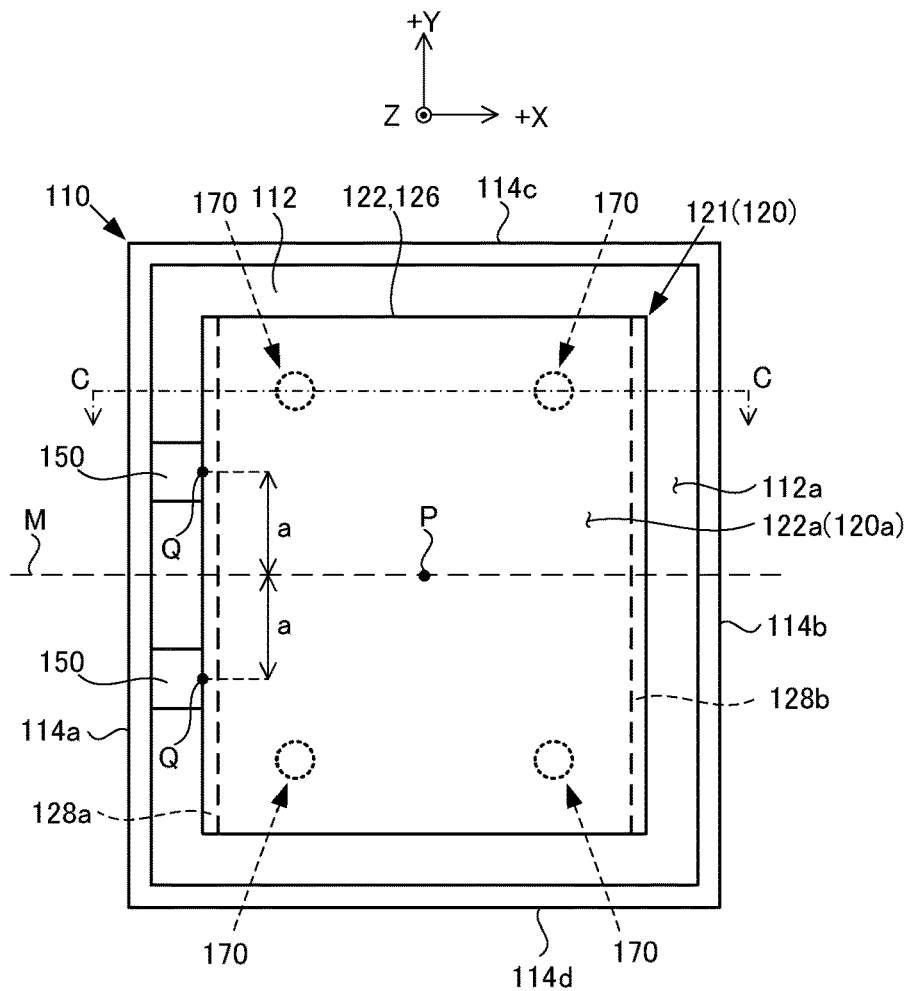
FIG. 10 is a plan view illustrating the tactile presentation device according to Embodiment 4.
Figure 11:
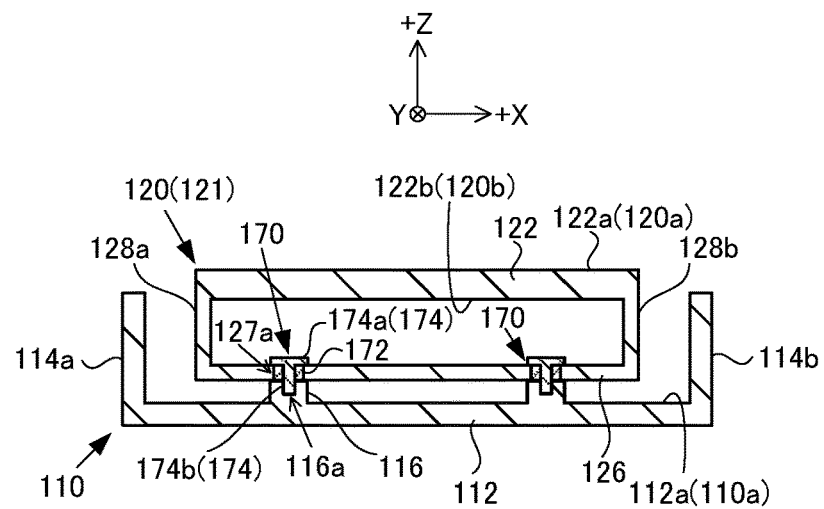
FIG. 11 is a cross-sectional view of the tactile presentation device illustrated FIG. 10 taken along line C-C.

As illustrated in FIG. 9 to FIG. 11, a tactile presentation device 100 of the present embodiment includes a base 110, a movable part 120, a bush part 170, two actuators 150, and a controller 160. Since the configuration of the controller 160 of the present embodiment is the same as that of Embodiment 1, the base 110, the movable part 120, the bush part 170, and the two actuators 150 are described. FIG. 10 and FIG. 11 do not illustrate a display 130 and a touch panel 131 of the movable part 120.

Figure 12:
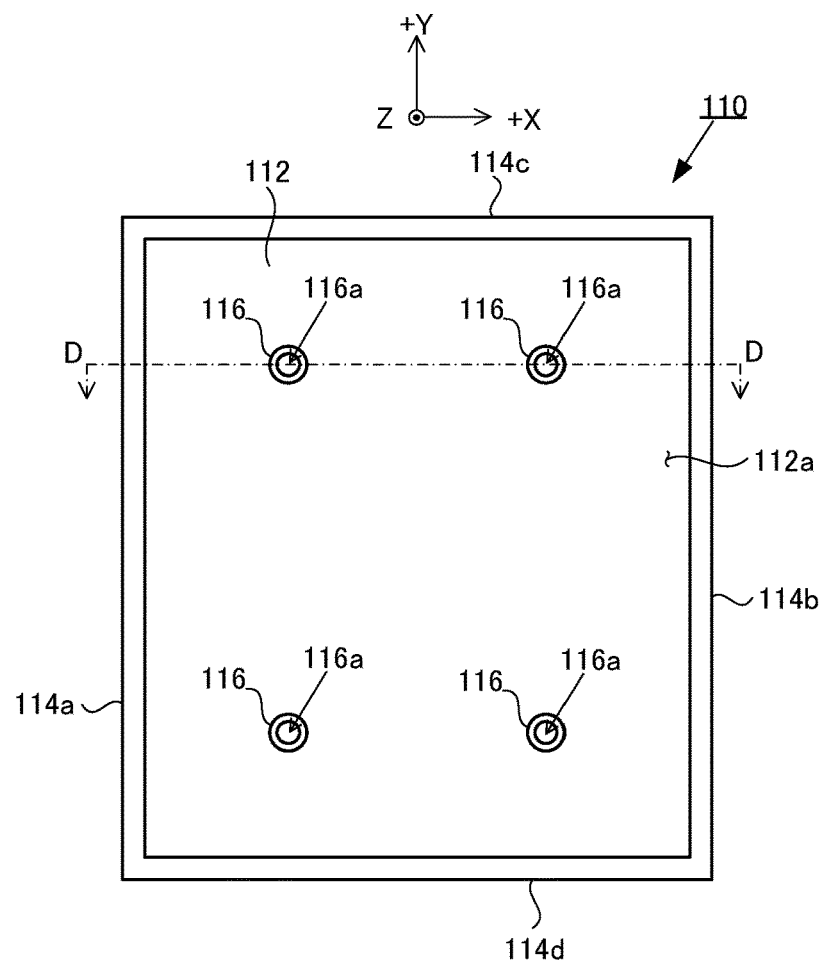
FIG. 12 is a plan view illustrating a base according to Embodiment 4.
Figure 13:
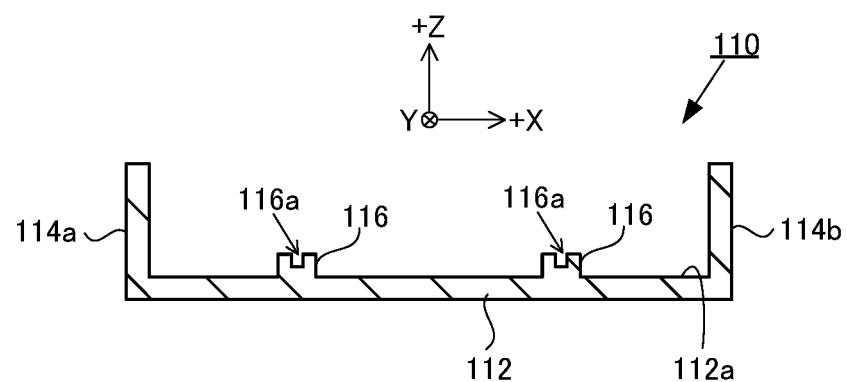
FIG. 13 is a cross-sectional view of the base illustrated FIG. 12 taken along line D-D.

The base 110 of the present embodiment supports the movable part 120 in a displaceable manner via the bush part 170. As illustrated in FIG. 12 and FIG. 13, the base 110 of the present embodiment has a box shape that opens in the +Z direction. The base 110 of the present embodiment includes a bottom plate 112 and four side plates 114a to 114d.

The bottom plate 112 is a flat plate having a rectangular shape. Four convex portions 116 are provided on a main surface 112a of the bottom plate 112, and the main surface 112a are facing the movable part 120. The four convex portions 116 are provided at positions corresponding respectively to through holes 127a to 127d of a lower plate 126 to be described below. The convex portions 116 each have a female hole 116a into which a shaft portion 174b of a connection pin 174 of the bush part 170 to be described below is fitted.

The movable part 120 of the present embodiment presents tactile to the user by being displaced in the X-axis direction. The movable part 120 of the present embodiment includes a carrier 121, the display 130, and the touch panel 131, similarly to the movable part 120 of Embodiment 1. Since the configurations of the display 130 and the touch panel 131 of the present embodiment are the same as those of Embodiment 1, the carrier 121 of the present embodiment is described below.

Figure 14:
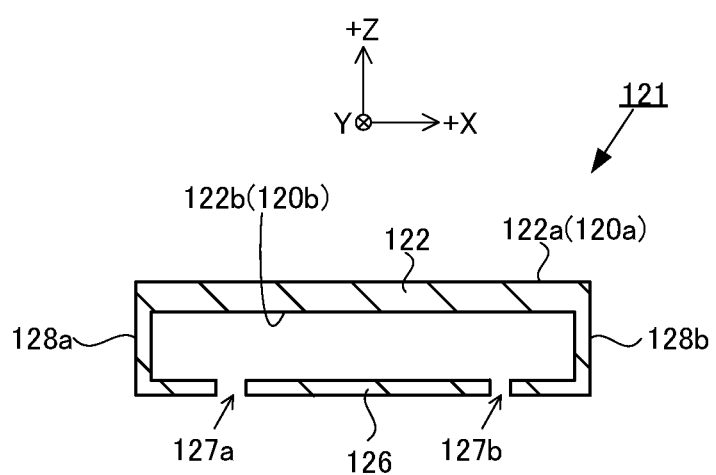
FIG. 14 is a cross-sectional illustrating a carrier according to Embodiment 4.

As illustrated in FIG. 14, the carrier 121 of the present embodiment includes an upper plate 122, the lower plate 126, and connectors 128a and 128b. The outer shape of the carrier 121 is smaller than the inner shape of the base 110. The carrier 121 is located inside the base 110.

The upper plate 122 of the present embodiment is a flat plate having a rectangular shape. The upper plate 122 of the present embodiment includes a first main surface 122a and a second main surface 122b opposite to the first main surface 122a. The first main surface 122a of the upper plate 122 of the present embodiment is parallel to the XY plane (X axis), is located on the +Z side, and corresponds to a first main surface 120a of the movable part 120. Furthermore, in the present embodiment, the second main surface 122b of the upper plate 122 is assumed to correspond to a second main surface 120b of the movable part 120.

Figure 15:
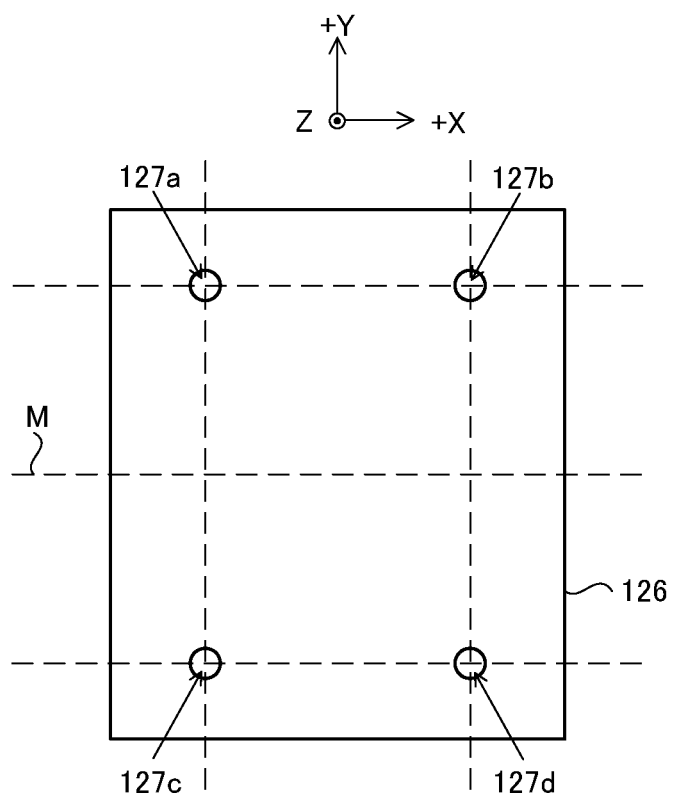
FIG. 15 is a plan view illustrating a lower plate of the carrier according to Embodiment 4.

The lower plate 126 is a flat plate having the same shape as the upper plate 122. The lower plate 126 is located on a side (−Z side) of the upper plate 122 facing the base 110, and is connected to the upper plate 122 by the connectors 128a and 128b. As illustrated in FIG. 15, the lower plate 126 is formed with the four through holes 127a to 127d. When viewed in the plan view from the +Z direction, the through holes 127a and 127b are located on the +Y side of the symmetry axis M passing through the center of gravity P of the movable part 120 and on a straight line parallel to the symmetry axis M. The through holes 127c and 127d are located on the −Y side of the symmetry axis M and on a straight line parallel to the symmetry axis M. Furthermore, the through hole 127a and the through hole 127c are symmetrically located with the symmetry axis M interposed therebetween. The through hole 127b and the through hole 127d are symmetrically located with the symmetry axis M interposed therebetween. The rubber bushes 172 of the bush part 170 are fitted into the through hole 127a to the through hole 127d, respectively.

The connectors 128a and 128b connect the upper plate 122 and the lower plate 126 at the −X side end and the +X side end of the upper plate 122 and the lower plate 126, respectively.

As illustrated in FIG. 11, the bush part 170 of the tactile presentation device 100 includes the rubber bush 172 and the connection pin 174. The rubber bush 172 is an annular elastic body. The rubber bush 172 is fitted into each of the through holes 127a to 127d of the lower plate 126 of the movable part 120. The rubber bush 172 is elastically deformed with the displacement of the movable part 120.

The connection pin 174 includes a head portion 174a and the shaft portion 174b. The shaft portion 174b of the connection pin 174 is inserted into the rubber bush 172 from the lower plate 126 side and is fixed to the female hole 116a of the convex portion 116 of the bottom plate 112, the rubber bush 172 being fitted into each of the through holes 127a to 127d. With this, the movable part 120 (carrier 121) and the base 110 (bottom plate 112 of the base 110) are connected. The shaft portion 174b of the connection pin 174 is an example of a shaft portion of the bush part 170.

In the present embodiment, when the movable part 120 is displaced, since the rubber bush 172, into which the shaft portion 174b has been inserted, is elastically deformed, the base 110 supporting the movable part 120 via the bush part 170 can support the movable part 120 in a displaceable manner.

Furthermore, the base 110 supports the movable part 120 via the bush part 170, so that it is possible to increase the strength against a touch operation of the user. Moreover, the base 110 supports the movable part 120 from the second main surface 120b side of the movable part 120. Consequently, even though a touch surface 131a of the touch panel 131 is strongly pressed by the user, the base 110 supports the movable part 120 from the second main surface 120b side of the movable part 120, so that it is possible to further increase the strength against a touch operation of the user.

Outputs of the two actuators 150 of the present embodiment are equal. As illustrated in FIG. 10, the two actuators 150 of the present embodiment are disposed between the −X side end of the movable part 120 and the side plate 114a of the base 110. When viewed in the plan view from the +Z direction, the two actuators 150 of the present embodiment are symmetrically disposed with the symmetry axis M of the movable part 120 interposed therebetween, similarly to the two actuators 150 of Embodiment 3. Consequently, similarly to the two actuators 150 of Embodiment 3, the two actuators 150 of the present embodiment can convert generated force into the displacement (vibration) of the movable part 120 in the X-axis direction with high efficiency and can strongly vibrate the movable part 120.

As described above, in the present embodiment, the base 110 supports the movable part 120 in a displaceable manner via the bush part 170, so that it is possible to increase the strength against a touch operation of the user. Furthermore, the base 110 supports the movable part 120 from the second main surface 120b side of the movable part 120, so that it is possible to further increase the strength against a touch operation of the user. Moreover, the two actuators 150 having the same output are disposed symmetrically with respect to the symmetry axis M of the movable part 120, thereby converting generated force into the displacement (vibration) of the movable part 120 in the X-axis direction with high efficiency and strongly vibrating the movable part 120. With this, the tactile presentation device 100 of the present embodiment can give strong vibration to the user.

Embodiment 5

In the tactile presentation device 100 of Embodiment 4, the rubber bush 172 of the bush part 170 is provided in the movable part 120. The rubber bush 172 of the bush part 170 may be provided in the base 110.

A tactile presentation device 100 of the present embodiment includes a base 110, a movable part 120, a bush part 170, and two actuators 150, similarly to the tactile presentation device 100 of Embodiment 4. Since the configuration of the two actuators 150 is the same as that of Embodiment 4, the base 110, the movable part 120, and the bush part 170 are described.

Figure 16:
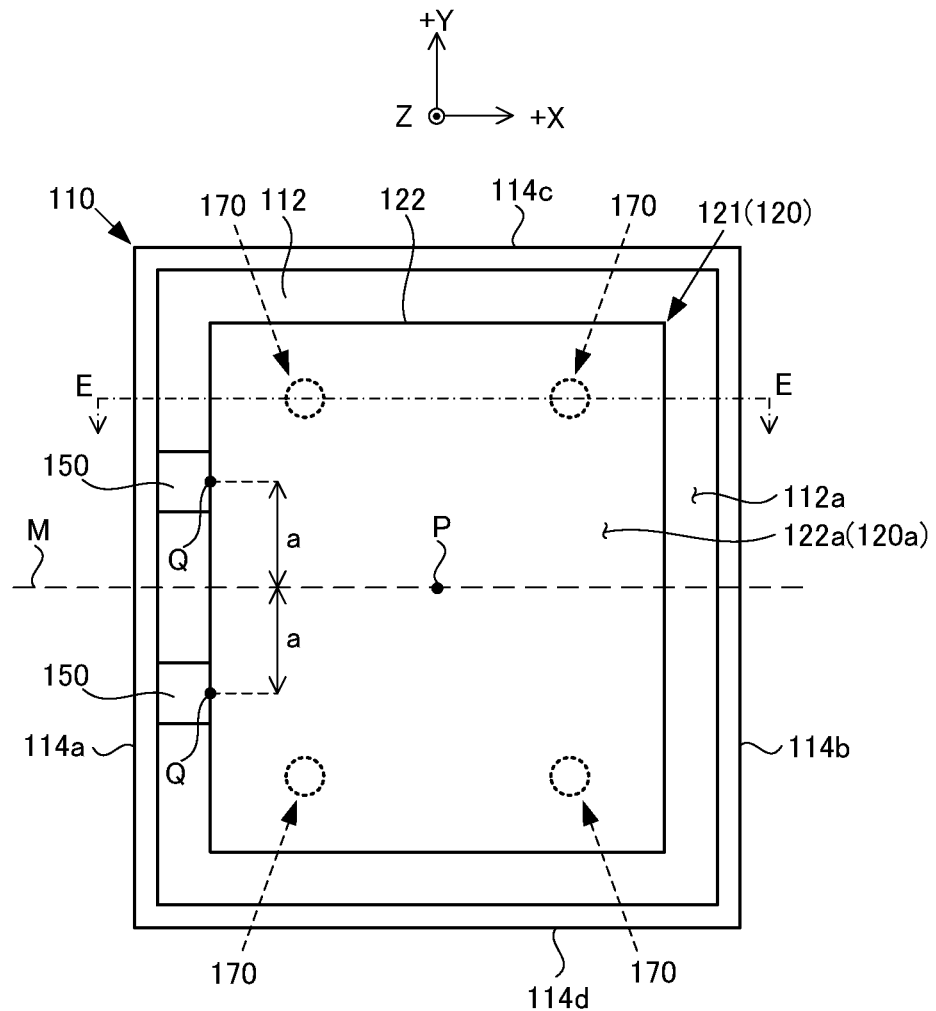
FIG. 16 is a plan view illustrating a tactile presentation device according to Embodiment 5.
Figure 17:
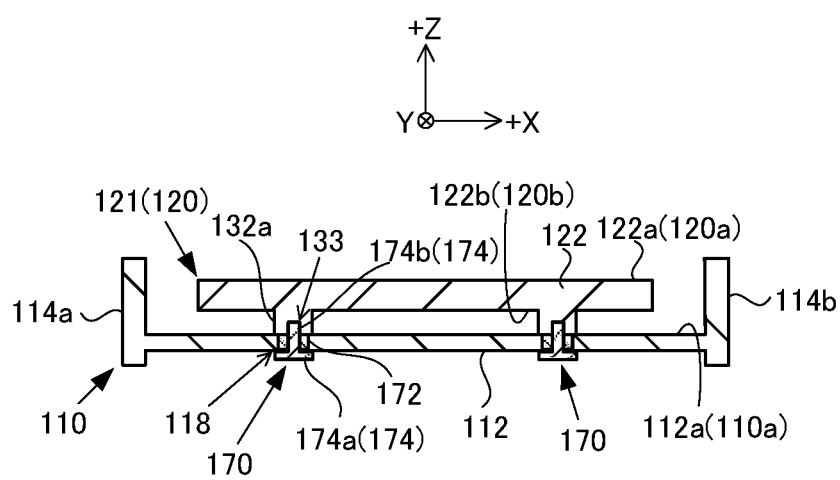
FIG. 17 is a cross-sectional view of the tactile presentation device illustrated FIG. 16 taken along line E-E.
Figure 18:
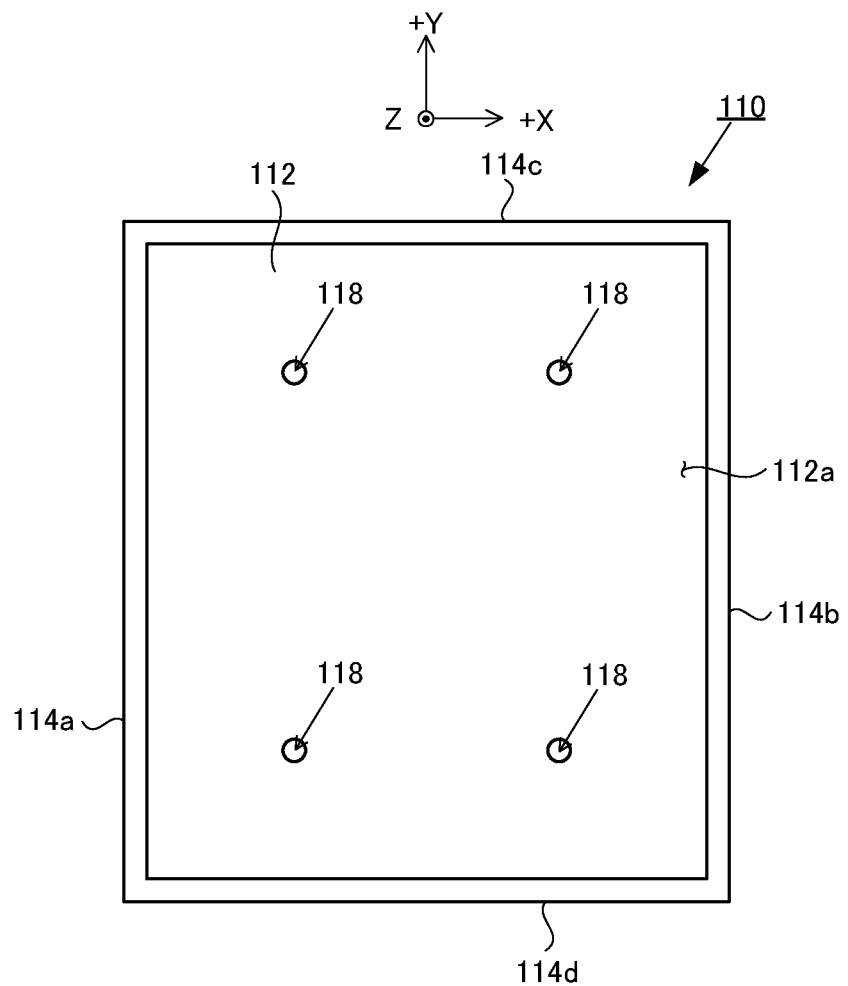
FIG. 18 is a plan view illustrating a base according to Embodiment 5.

The base 110 of the present embodiment supports the movable part 120 in a displaceable manner via the bush part 170, similarly to the base 110 of Embodiment 4. As illustrated in FIG. 16 and FIG. 17, the base 110 of the present embodiment has a box shape that opens in the +Z direction. The base 110 of the present embodiment includes a bottom plate 112 and four side plates 114a to 114d. As illustrated in FIG. 18, the bottom plate 112 of the present embodiment is formed with four through holes 118. The four through holes 118 are provided at positions corresponding respectively to convex portions 132a to 132d of a carrier 121 to be described below. A rubber bush 172 of the bush part 170 is fitted into the through hole 118.

Figure 19:
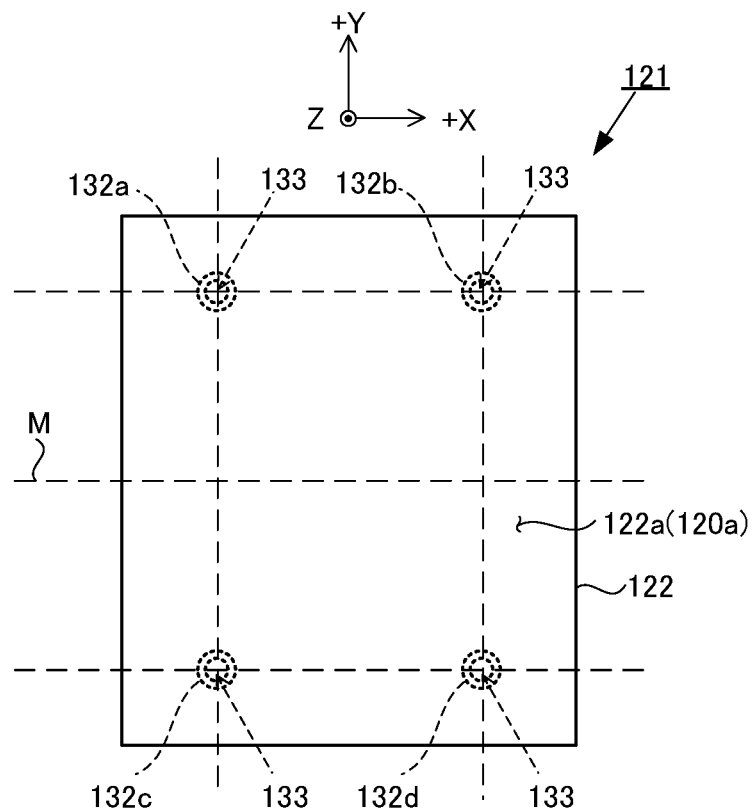
FIG. 19 is a plan view illustrating a carrier according to Embodiment 5.

The movable part 120 of the present embodiment presents tactile to the user by being displaced in the X-axis direction, similarly to the movable part 120 of Embodiment 4. The movable part 120 of the present embodiment includes the carrier 121, a display 130, and a touch panel 131, similarly to the movable part 120 of Embodiment 1. Since the configurations of the display 130 and the touch panel 131 are the same as those of Embodiment 1, the carrier 121 of the present embodiment is described below. As illustrated in FIG. 19, the carrier 121 of the present embodiment includes an upper plate 122 and the convex portions 132a to 132d.

The upper plate 122 of the present embodiment is a flat plate having a rectangular shape. The upper plate 122 of the present embodiment includes a first main surface 122a and a second main surface 122b opposite to the first main surface 122*a*. The first main surface 122*a* of the upper plate 122 of the present embodiment is parallel to the XY plane (X axis), is located on the +Z side, and corresponds to a first main surface 120*a* of the movable part 120. The second main surface 122*b* of the upper plate 122 of the present embodiment is located on the −Z side, and corresponds to a second main surface 120*b* of the movable part 120.

The convex portions 132*a* to 132*d* of the present embodiment are provided on the second main surface 122*b* of the upper plate 122. When viewed in the plan view from the +Z direction, the convex portion 132*a* and the convex portion 132*b* are located on the +Y side of the symmetry axis M passing through the center of gravity P of the movable part 120 and on a straight line parallel to the symmetry axis M. The convex portion 132*c* and the convex portion 132*d* are located on the −Y side of the symmetry axis M and on a straight line parallel to the symmetry axis M. Furthermore, the convex portion 132*a* and the convex portion 132*c* are symmetrically located with the symmetry axis M interposed therebetween. The convex portion 132*b* and the convex portion 132*d* are symmetrically located with the symmetry axis M interposed therebetween. The convex portions 132*a* to 132*d* each have a female hole 133 into which a shaft portion 174*b* of a connection pin 174 of the bush part 170 is fitted.

The bush part 170 of the present embodiment includes a rubber bush 172 and the connection pin 174, similarly to the bush part 170 of Embodiment 4. The rubber bush 172 of the present embodiment is an annular elastic body, and is fitted into each of the through holes 118 of the bottom plate 112 as illustrated in FIG. 17. The rubber bush 172 of the present embodiment is elastically deformed with the displacement of the movable part 120.

The connection pin 174 of the present embodiment includes a head portion 174*a* and the shaft portion 174*b*, similarly to the connection pin 174 of Embodiment 4. The shaft portion 174*b* of the connection pin 174 is inserted into the rubber bush 172 from the bottom plate 112 side and is fixed to the female hole 133 of each of the convex portions 132*a* to 132*d* of the movable part 120, the rubber bush 172 being fitted into each of the through holes 118 of the bottom plate 112. With this, the movable part 120 (carrier 121) and the base 110 are connected.

In the present embodiment, the movable part 120 is displaced, the shaft portion 174*b* of the connection pin 174 (connection pin 174) is displaced, and the rubber bush, into which the shaft portion 174*b* has been inserted, is elastically deformed. Consequently, the base 110 supporting the movable part 120 via the bush part 170 can support the movable part 120 in a displaceable manner.

Furthermore, the base 110 supports the movable part 120 via the bush part 170, so that it is possible to increase the strength against a touch operation of the user, similarly to Embodiment 4. Moreover, the base 110 supports the movable part 120 from the second main surface 120*b* side of the movable part 120. Consequently, even though a touch surface 131*a* of the touch panel 131 is strongly pressed by the user, the base 110 supports the movable part 120 from the second main surface 120*b* side of the movable part 120, so that it is possible to further increase the strength against a touch operation of the user.

As described above, similarly to Embodiment 4, the base 110 supports the movable part 120 in a displaceable manner via the bush part 170, so that it is possible to increase the strength against a touch operation of the user. Furthermore, the base 110 supports the movable part 120 from the second main surface 120*b* side of the movable part 120, so that it is possible to further increase the strength against a touch operation of the user. Moreover, similarly to Embodiment 4, when viewed in the plan view from the +Z direction, the two actuators 150 having the same output are disposed symmetrically with respect to the symmetry axis M of the movable part 120, thereby converting generated force into the displacement (vibration) of the movable part 120 in the X-axis direction with high efficiency and strongly vibrating the movable part 120.

Modification

Although the embodiments have been described above, the present disclosure can be changed in various ways without departing from the gist.

Figure 20:
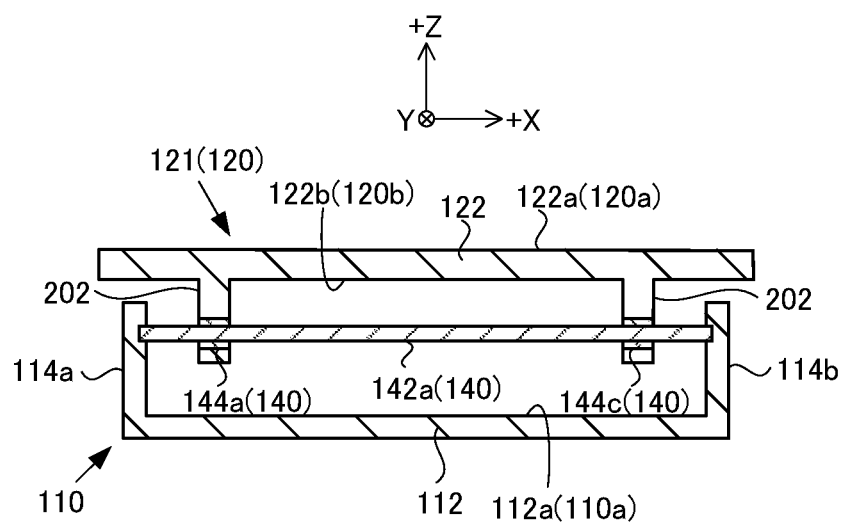
FIG. 20 is a cross-sectional view of a tactile presentation device according to a modification.

In Embodiment 1 and Embodiment 2, the carrier 121 has a box shape. The shape of the carrier 121 is not limited to the box shape. For example, as illustrated in FIG. 20, the carrier 121 of Embodiment 1 may include leg portions 202 on the upper plate 122 having a flat plate shape. In such a case, the bearings 144*a* to 144*d* are provided on the leg portions 202, respectively. The outer shape of the upper plate 122 may be larger than that of the base 110 as illustrated in FIG. 20.

Figure 21:
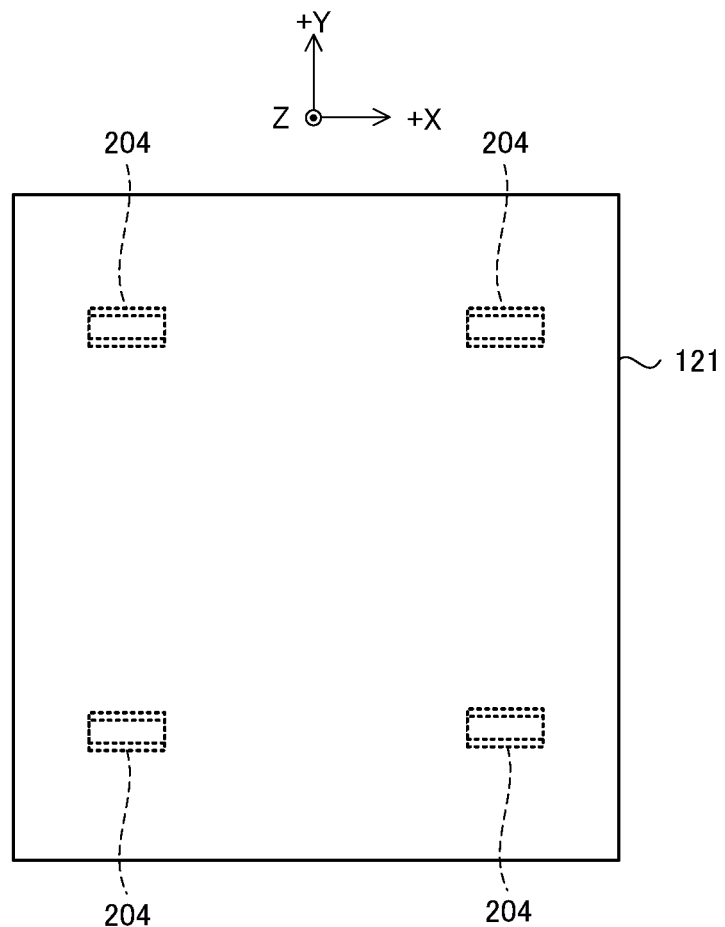
FIG. 21 is a plan view illustrating a carrier according to the modification.
Figure 22:
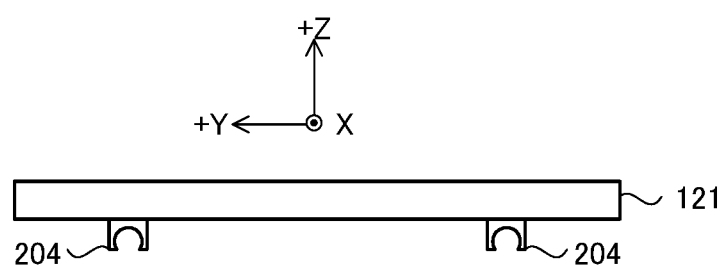
FIG. 22 is a side view illustrating the carrier according to the modification.

Moreover, as illustrated in FIG. 21 and FIG. 22, the carrier 121 of Embodiment 1 may have a flat plate shape. In such a case, instead of the bearings 144*a* to 144*d* of the guider 140, for example, U-shaped bearings 204 of the guider 140 are provided on a first main surface of the carrier 121.

In Embodiment 1 and Embodiment 2, when viewed in the plan view from the +Z direction, the shaft 142*a* and the shaft 142*b* are symmetrically disposed on the +Y side and the −Y side with the symmetry axis M of the movable part 120 interposed therebetween. When viewed in the plan view from the +Z direction, the shaft 142*a* and the shaft 142*b* may not be symmetrically disposed on the +Y side and the −Y side with the symmetry axis M of the movable part 120 interposed therebetween. That is, when viewed in the plan view from the +Z direction, the guider 140 may not be symmetrically disposed on the +Y side and the −Y side with the symmetry axis M of the movable part 120 interposed therebetween.

In Embodiment 4 and Embodiment 5, the upper plate 122 and the lower plate 126 of the carrier 121 have the same shape, but the upper plate 122 and the lower plate 126 are not limited to the same shape. Furthermore, the carrier 121 is not limited to including the upper plate 122, the lower plate 126, and the connectors 128*a* and 128*b*. For example, the carrier 121 in Embodiment 4 and Embodiment 5 may include only the upper plate 122.

In Embodiment 4 and Embodiment 5, the bush parts 170 (through holes 127*a* to 127*d* or convex portions 132*a* to 132*d*) are symmetrically disposed. The bush parts 170 may not be symmetrically disposed.

Figure 23:
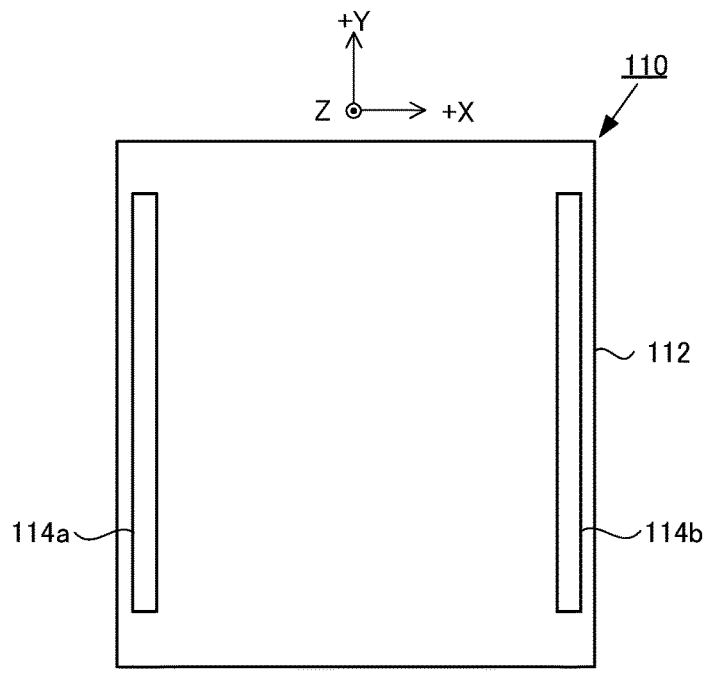
FIG. 23 is a plan view illustrating a base according to the modification.

In Embodiment 1 to Embodiment 5, the base 110 has a box shape. The shape of the base 110 is not limited to the box shape. For example, as illustrated in FIG. 23, the base 110 of Embodiment 1 may include the bottom plate 112 having a flat plate shape and the side plates 114*a* and 114*b* provided with the shafts 142*a* and 142*b*.

Moreover, in Embodiment 1, the side plates 114*a* and 114*b* provided with the shafts 142*a* and 142*b* may also constitute the base 110 together with other members (a housing or a circuit board of a device mounted with the tactile presentation device 100, a support member provided in a device mounted with the tactile presentation device 100, or the like). In Embodiment 2, the side plates 114*a* and 114*b* provided with the bearings 144*a* to 144*d* may also constitute the base 110 together with other members.

Figure 24:
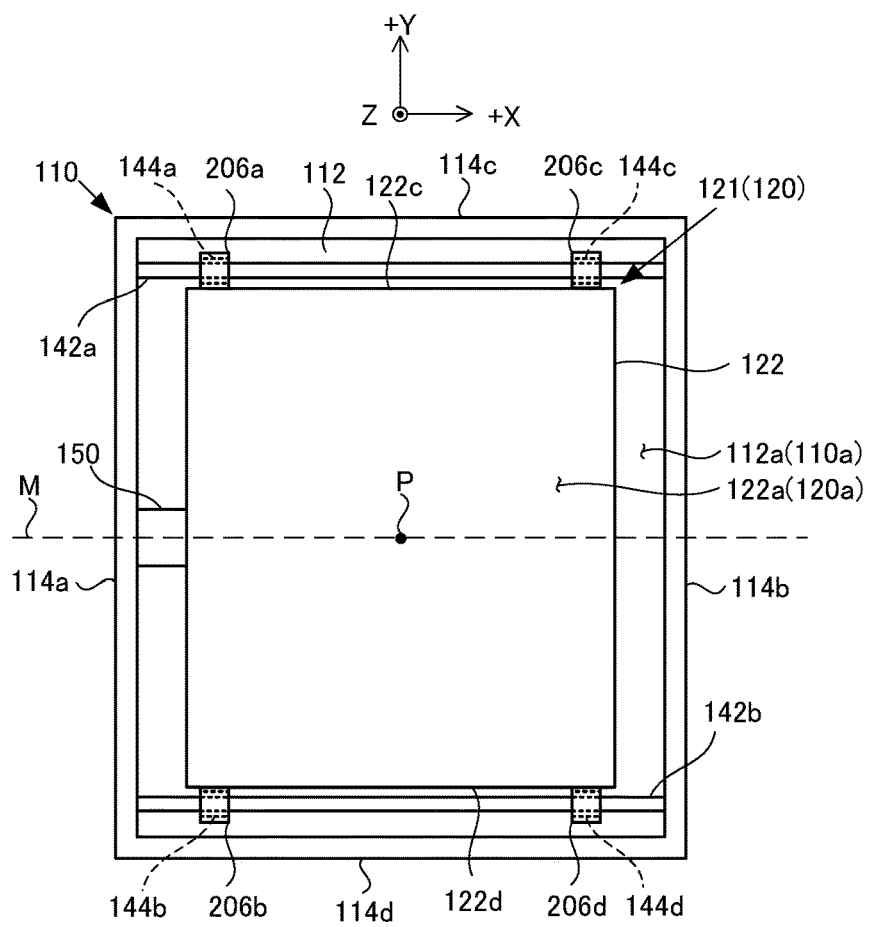
FIG. 24 is a plan view illustrating the base, the carrier, and a guider according to the modification.

The guider 140 in Embodiment 1 and Embodiment 2 is disposed between the second main surface 120b of the movable part 120 and the third main surface 110a of the base 110; however, the arrangement of the guider 140 is not limited thereto. For example, as illustrated in FIG. 24, the shaft 142a of the guider 140 may be located parallel to a side surface 122c of the upper plate 122 of the carrier 121 and the shaft 142b of the guider 140 may be located parallel to a side surface 122d of the upper plate 122 of the carrier 121. In such a case, convex portions 206a and 206c are provided on the side surface 122c of the upper plate 122 on the +Y side. The bearings 144a and 144c of the guider 140 are provided in the convex portions 206a and 206c, respectively. The shaft 142a is inserted into the bearings 144a and 144c. Convex portions 206b and 206d are provided on the side surface 122d of the upper plate 122 on the −Y side, and the bearings 144b and 144d of the guider 140 are provided in the convex portions 206b and 206d, respectively. The shaft 142b is inserted into the bearings 144b and 144d.

Figure 25:
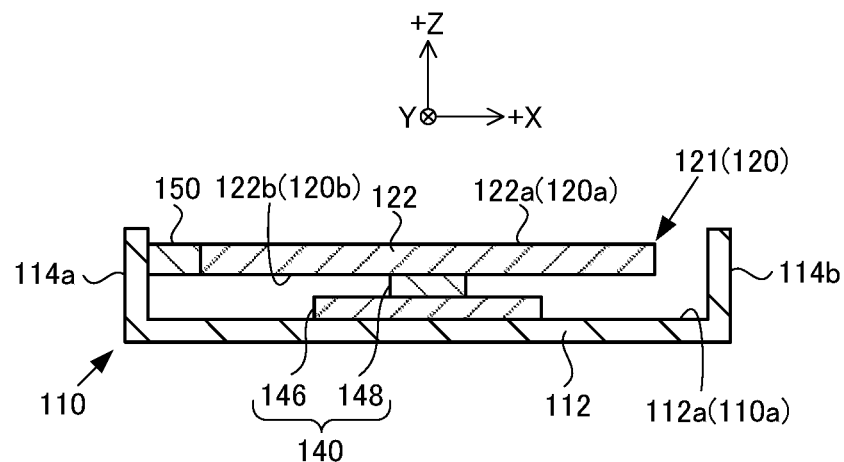
FIG. 25 is a cross-sectional view illustrating the guider according to the modification.

The guider 140 of the tactile presentation device 100 is not limited to the combination of the shafts 142a and 142b and the bearings 144a to 144d. For example, as illustrated in FIG. 25, the guider 140 may be a linear guide including a rail 146 provided on the bottom plate 112 of the base 110 and extending in the X-axis direction, and a block 148 attached to the second main surface 122b of the upper plate 122 of the carrier 121 and moving on the rail 146.

The display 130 of the movable part 120 is not limited to a liquid crystal display panel. The display 130 may be an organic electro luminescence (EL) display panel, a printed matter, or the like.

In Embodiment 1 to Embodiment 5, the movable part 120 includes the carrier 121, the display 130, and the touch panel 131; however, the configuration of the movable part 120 is not limited thereto. For example, the movable part 120 may include the display 130 and the touch panel 131. In such a case, the display 130 and the base 110 are connected by the guider 140 or the bush part 170. Furthermore, the movable part 120 may include the carrier 121 and the display 130, or may include the carrier 121 and the touch panel 131. Moreover, the movable part 120 may include only any one of the carrier 121, the display 130, and the touch panel 131. For example, when the movable part 120 includes only the display 130, the display 130 and the base 110 are connected by the guider 140 or the bush part 170.

Figure 26:
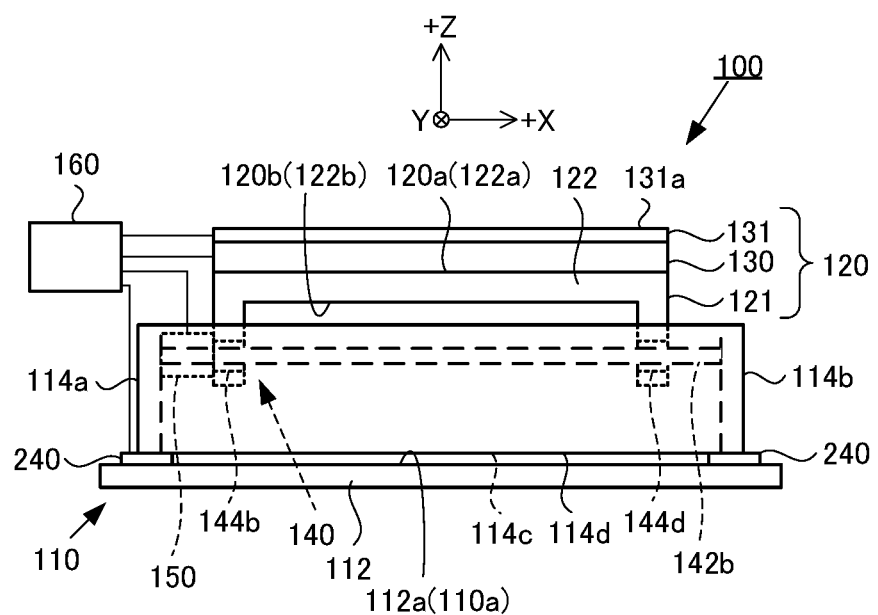
FIG. 26 is a side view illustrating the tactile presentation device according to the modification.

The tactile presentation device 100 may also include force sensors 240 at four corners thereof. For example, as illustrated in FIG. 26, the force sensors 240 is provided between the bottom plate 112 of the base 110 and the side plates 114a to 114d of the base 110 supporting the movable part 120. The force sensor 240 detects force (force in the −Z direction) with which the user presses the touch surface 131a of the touch panel 131. In such a case, the controller 160 controls the vibration intensity of the movable part 120 according to the force detected by the force sensor 240. For example, when the force sensor 240 detects a load equal to or greater than a predetermined setting value, the controller 160 controls the vibration intensity of the movable part 120 to present a click feeling to a user.

The tactile presentation devices 100 of Embodiment 4 and Embodiment 5 may include a plurality of (three or more) actuators 150 having the same output, similarly to the tactile presentation devices 100 of Embodiment 1 and Embodiment 2. In such a case, when viewed in the plan view from the +Z direction, the plurality of actuators 150 having the same output is disposed symmetrically with respect to the symmetry axis M of the movable part 120.

The tactile presentation devices 100 of Embodiment 1 to Embodiment 5 may also include a plurality of actuators 150 having different outputs. For example, in a case where the tactile presentation device 100 includes two actuators 150 having different outputs, when viewed in the plan view from the +Z direction, the two actuators 150 are disposed at positions, where the ratio of a vertical distance (L6=c) between one actuator 150 and the symmetry axis M to a vertical distance (L7=d) between the other actuator 150 and the symmetry axis M is the inverse ratio of the ratio of output S1 of the one actuator 150 to output S2 of the other actuator 150 (S1>S2), with the symmetry axis M parallel to the X-axis direction of the movable part 120 interposed therebetween.

Figure 27:
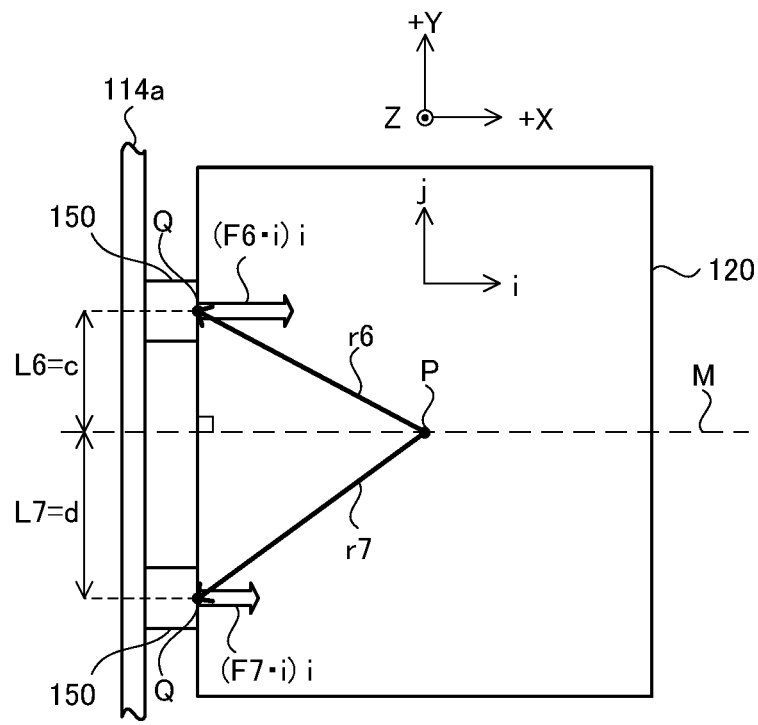
FIG. 27 is a schematic view for explaining rotational moments with respect to the center of gravity according to the modification.

In such a case, as illustrated in FIG. 27 and expressed by Equation (13) to Equation (18) below, the sum $\Sigma Nm$ of rotational moments with respect to the center of gravity P in the plane parallel to the XY plane is zero. Consequently, generated force can be converted into the displacement (vibration) of the movable part 120 in the X-axis direction with high efficiency and the movable part 120 can be strongly vibrated. In Equation (13) to Equation (18) below, F6 represents a vector of force applied to the movable part 120 by the one actuator 150 having the output S1, and r6 represents a vector from the center of gravity P to the point of action Q of the force applied by the one actuator 150. F7 represents a vector of force applied to the movable part 120 by the other actuator 150 having the output S2, and r7 represents a vector from the center of gravity P to the point of action Q of the force applied by the other actuator 150.

$$(r6 \cdot j)j = \begin{pmatrix} 0 \\ c \\ 0 \end{pmatrix} \quad (13)$$

$$(r7 \cdot j)j = \begin{pmatrix} 0 \\ d \\ 0 \end{pmatrix} \quad (14)$$

$$(F6 \cdot i)i = \begin{pmatrix} F6 \cdot i \\ 0 \\ 0 \end{pmatrix} \quad (15)$$

$$(F7 \cdot i)i = \begin{pmatrix} F7 \cdot i \\ 0 \\ 0 \end{pmatrix} \quad (16)$$

$$-\frac{d}{c} = \frac{S1}{S2} = \frac{F6 \cdot i}{F7 \cdot i} \quad (17)$$

$$\Sigma Nm = (r6 \cdot j)j \times (F6 \cdot i)i + (r7 \cdot j)j \times (F7 \cdot i)i = \quad (18)$$

$$\begin{pmatrix} 0 \\ 0 \\ -c(F6 \cdot i) \end{pmatrix} + \begin{pmatrix} 0 \\ 0 \\ -d(F7 \cdot i) \end{pmatrix} = \begin{pmatrix} 0 \\ 0 \\ 0 \end{pmatrix}$$

The characteristics of the present disclosure is described from other aspects. The tactile presentation device 100 includes m actuators 150 (m is an integer equal to or greater than 1), and the movable part 120 of the tactile presentation device 100 is displaced in the X-axis direction (predetermined one axial direction). In such a case, each of the m actuators 150 satisfies Equation (19) and Equation (20) below, and is disposed so that force in the X-axis direction (predetermined one axial direction) is main force. In Equation (19) and Equation (20) below, Fm represents a vector of force applied to the movable part 120 by an $m^{th}$ actuator 150, and k represents a unit vector in the Z-axis direction.

$$|Fm \cdot i| >> |Fm \cdot j| \quad (19)$$

$$|Fm \cdot i| >> |Fm \cdot k| \quad (20)$$

Moreover, each of the m actuators 150 is disposed to satisfy Equation (21) and Equation (22) below. In Equation (21) and Equation (22) below, rm represents a position vector of the point of action Q of the force Fm with respect to the center of gravity P of the movable part 120.

$$|rm \cdot i| >> |rm \cdot k| \quad (21)$$

$$|rm \cdot j| >> |rm \cdot k| \quad (22)$$

The sum ΣNm of rotational moments with respect to the center of gravity P of the movable part 120 is obtained.

The force Fm applied to the movable part 120 by the $m^{th}$ actuator 150 and the position vector rm of the point of action Qm of the force Fm with respect to the center of gravity P of the movable part 120 can be expressed by Equation (23) and Equation (24) below.

$$Fm = \begin{pmatrix} Fm \cdot i \\ Fm \cdot j \\ Fm \cdot k \end{pmatrix} \quad (23)$$

$$rm = \begin{pmatrix} rm \cdot i \\ rm \cdot j \\ rm \cdot k \end{pmatrix} \quad (24)$$

With respect to the force Fm applied to the movable part 120 by the $m^{th}$ actuator 150, the rotational moment Nm with respect to the center of gravity P of the movable part 120 is expressed by Equation (25) below.

$$Nm = rm \times Fm = \begin{pmatrix} (rm \cdot j)(Fm \cdot k) - (rm \cdot k)(Fm \cdot j) \\ (rm \cdot k)(Fm \cdot i) - (rm \cdot i)(Fm \cdot k) \\ (rm \cdot i)(Fm \cdot j) - (rm \cdot j)(Fm \cdot i) \end{pmatrix} \quad (25)$$

As described above, since each of the m actuators 150 satisfies Equation (19) and Equation (20) above and is disposed so that the force in the X-axis direction (predetermined one axial direction) is the main force, it can be approximated as in Equation (26) and Equation (27) below.

$$|Fm \cdot j| \approx 0 \quad (26)$$

$$|Fm \cdot k| \approx 0 \quad (27)$$

When the approximations of Equation (26) and Equation (27) above are applied to Equation (25) above, the rotational moment Nm with respect to the center of gravity P of the movable part 120 can be expressed by Equation (28) below with respect to the force Fm applied to the movable part 120 by the $m^{th}$ actuator 150.

$$Nm = \begin{pmatrix} 0 \\ (rm \cdot k)(Fm \cdot i) \\ -(rm \cdot j)(Fm \cdot i) \end{pmatrix} = (Fm \cdot i) \begin{pmatrix} 0 \\ rm \cdot k \\ -(rm \cdot j) \end{pmatrix} \quad (28)$$

Furthermore, as described above, since each of the m actuators 150 is disposed to satisfy Equation (22) above, it can be approximated as in Equation (29) below.

$$\begin{pmatrix} 0 \\ rm \cdot k \\ -(rm \cdot j) \end{pmatrix} \approx \begin{pmatrix} 0 \\ 0 \\ -(rm \cdot j) \end{pmatrix} \quad (29)$$

When the approximation of Equation (29) above is applied to Equation (28) above, the rotational moment Nm with respect to the center of gravity P of the movable part 120 can be expressed by Equation (30) below with respect to the force Fm applied to the movable part 120 by the $m^{th}$ actuator 150.

$$Nm = \begin{pmatrix} 0 \\ 0 \\ -(rm \cdot j)(Fm \cdot i) \end{pmatrix} = \begin{pmatrix} 0 \\ rm \cdot j \\ 0 \end{pmatrix} \times \begin{pmatrix} Fm \cdot i \\ 0 \\ 0 \end{pmatrix} = [(rm \cdot j)j] \times [(Fm \cdot i)i] \quad (30)$$

From the above, in the tactile presentation device 100 including the m actuators 150, the sum ΣNm of rotational moments with respect to the center of gravity P of the movable part 120 is expressed by Equation (31) below. In the present disclosure, each of the m actuators 150 is disposed with respect to the movable part 120 so that the sum ΣNm of rotational moments with respect to the center of gravity P of the movable part 120 is zero.

$$\Sigma Nm = \Sigma [(rm \cdot j)j] \times [(Fm \cdot i)i] \quad (31)$$

Figure 28:
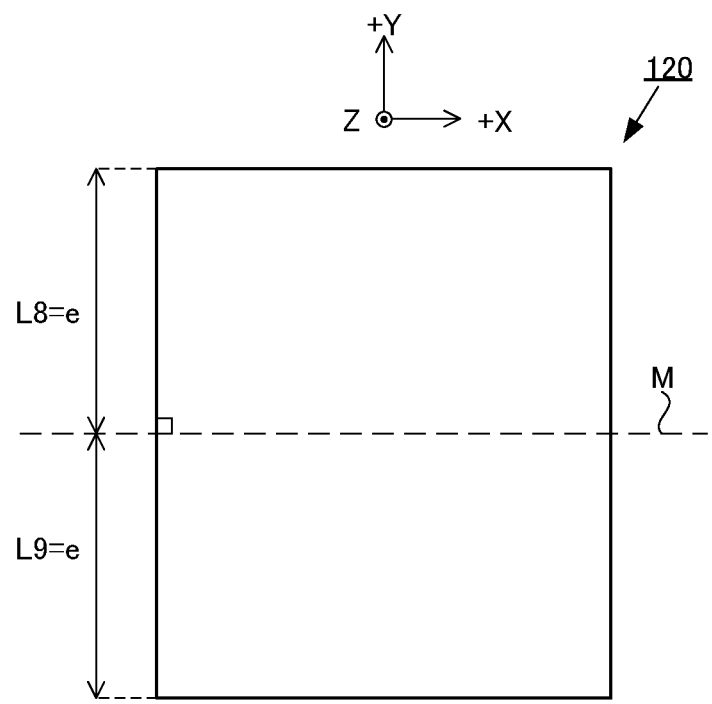
FIG. 28 is a plan view illustrating a symmetry axis according to the modification.

The symmetry axis M of Embodiment 1 to Embodiment 5 is an axis that passes through the center of gravity P of the movable part 120. As illustrated in FIG. 28, the symmetry axis M may be an axis that is parallel to the X-axis direction (predetermined one axial direction) and divides the first main surface 120a of the movable part 120 into two equal parts when the first main surface 120a of the movable part 120 is viewed in the plan view (L8=L9=e).

Modification 1

In Embodiment 1 to Embodiment 5, the actuator 150 is disposed between the −X side end of the carrier 121 and the side plate 114a of the base 110. The actuator 150 may be disposed at other positions. The configuration of a tactile presentation device 100 of the present modification is the same as that of Embodiment 1 except for the arrangement of the actuator 150.

Figure 29:
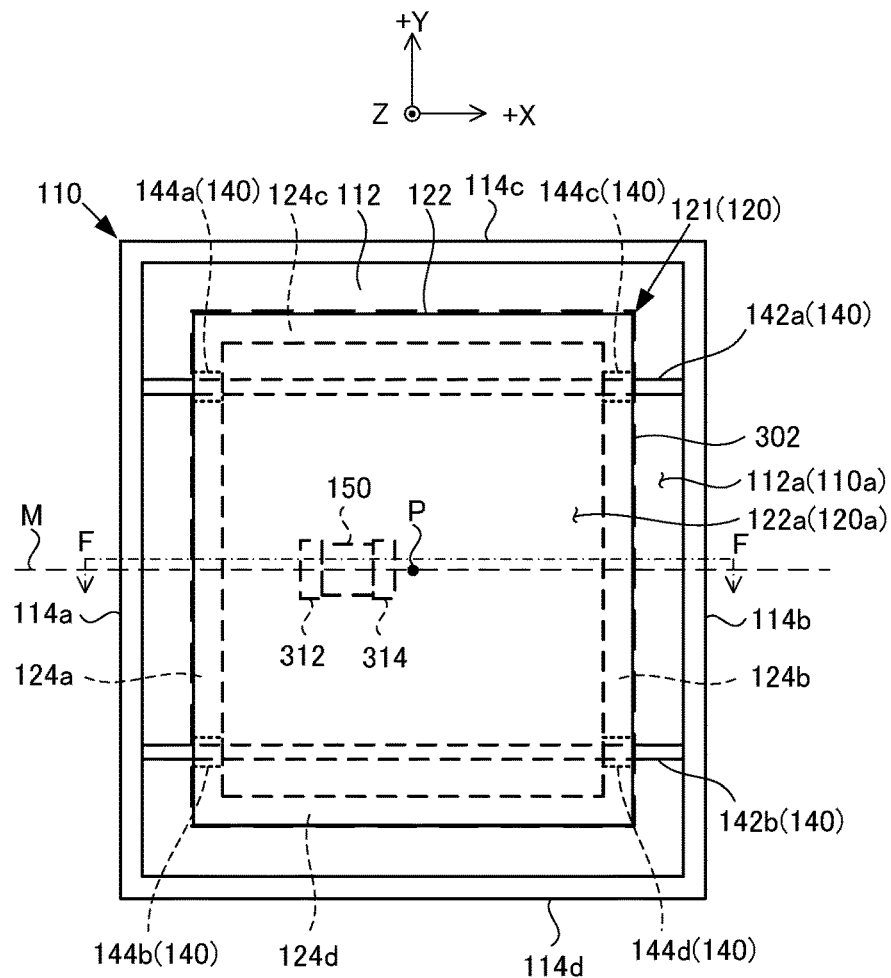
FIG. 29 is a plan view illustrating a tactile presentation device according to Modification 1.
Figure 30:
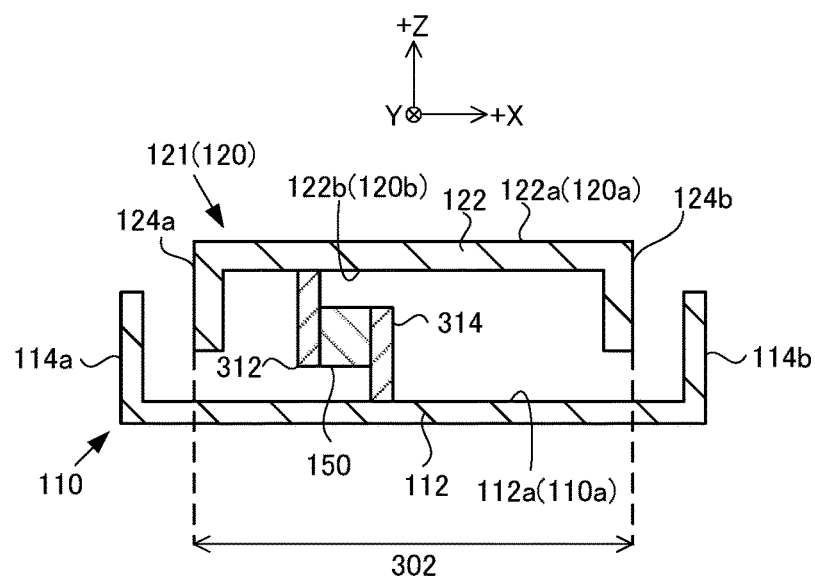
FIG. 30 is a cross-sectional view of the tactile presentation device illustrated FIG. 29 taken along line F-F.

As illustrated in FIG. 29 and FIG. 30, when viewed in the plan view from the +Z direction, the actuator 150 is disposed in a region 302 surrounded by the −X side end, the +X side end, the −Y side end, and the +Y side end of the carrier 121 (between the movable part 120 and the bottom plate 112 of the base 110). The actuator 150 is, for example, a piezo actuator. In the present modification, one of the stator and the mover of the actuator 150 is connected to the second main surface 122b of the carrier 121 (second main surface 120b of the movable part 120). Furthermore, the other one of the stator and the mover of the actuator 150 is connected to the third main surface 110a of the base 110.

The actuator 150 is connected to the second main surface 122b of the carrier 121 via, for example, an adapter 312 made of metal. Furthermore, the actuator 150 is connected to the third main surface 110a of the base 110 via, for example, an adapter 314 made of metal.

In a case where the tactile presentation device 100 includes one actuator 150, when viewed in the plan view from the +Z direction, the actuator 150 is located on the symmetry axis M parallel to the X-axis direction of the movable part 120 as illustrated in FIG. 29. Furthermore, in a case where the tactile presentation device 100 includes two actuators 150 and the two actuators 150 have different outputs, when viewed in the plan view from the +Z direction, the two actuators 150 are disposed at positions where the ratio of the vertical distance L6 between one actuator 150 and the symmetry axis M to the vertical distance L7 between the other actuator 150 and the symmetry axis M is the inverse ratio of the ratio of the output S1 of the one actuator 150 to the output S2 of the other actuator 150. Moreover, in a case where the tactile presentation device 100 includes a plurality of actuators 150 and the plurality of actuators 150 has the same output, when viewed in the plan view from the +Z direction, the plurality of actuators 150 is symmetrically disposed with the symmetry axis M. In these arrangements of the actuators 150, the sum of rotational moments with respect to the center of gravity P of the movable part 120 in the plane parallel to the first main surface 120a of the movable part 120 is zero.

Modification 2

In Modification 1, the actuator 150 is a piezo actuator. The actuator 150 may be a solenoid. In a tactile presentation device 100 of the present modification and the tactile presentation device 100 of Modification 1, connection methods of actuator 150 are difference. The tactile presentation device 100 of the present modification has elastic members 316 and 318. The other configurations of the tactile presentation device 100 of the present modification are the same as those of Modification 1.

Figure 31:
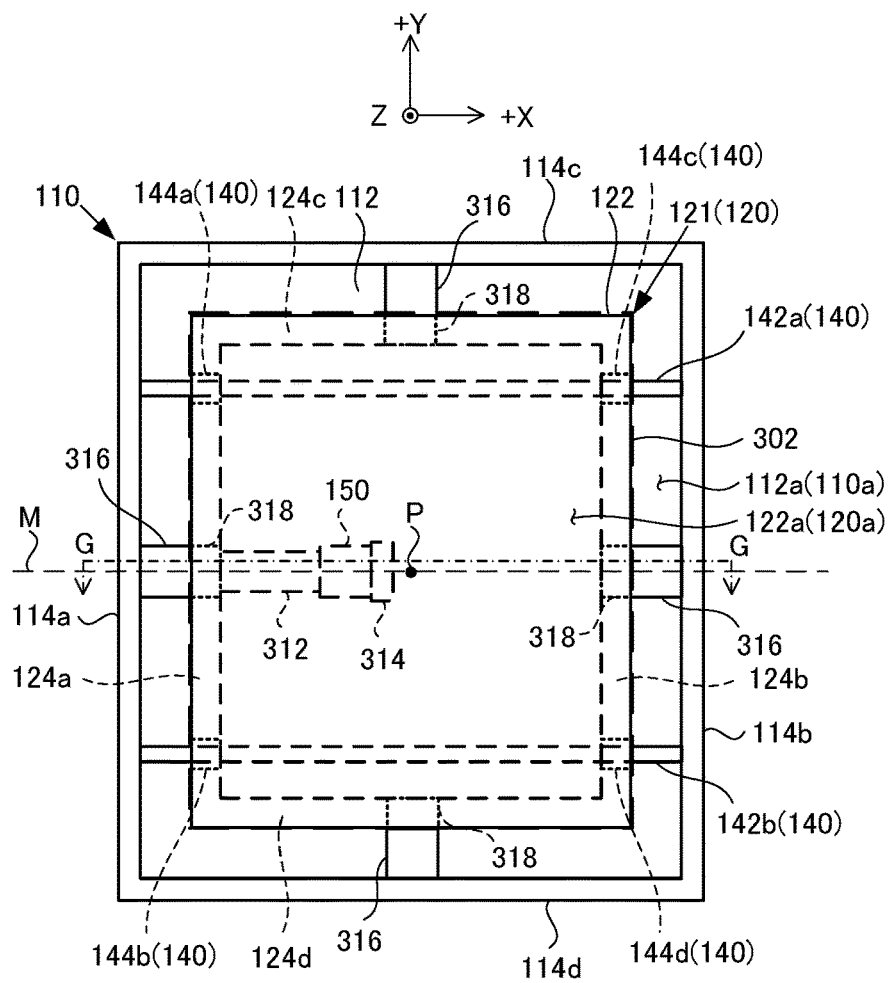
FIG. 31 is a plan view illustrating a tactile presentation device according to Modification 2.
Figure 32:
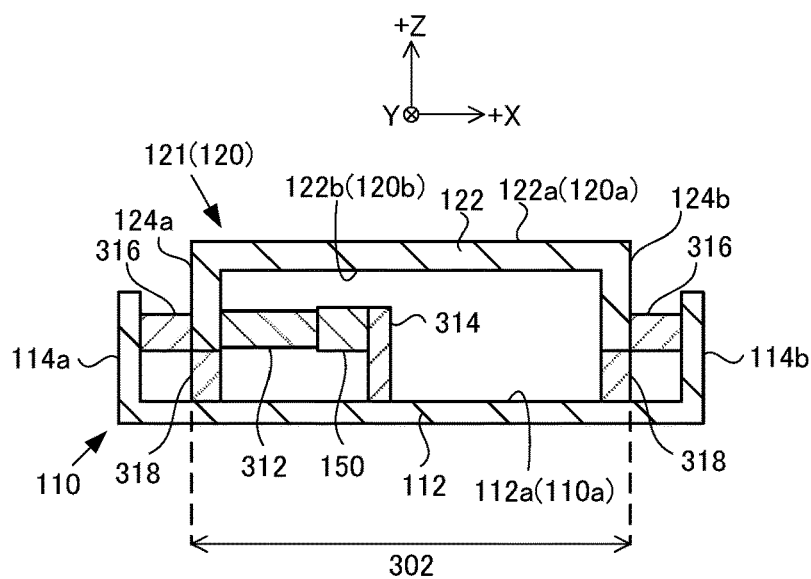
FIG. 32 is a cross-sectional view of the tactile presentation device illustrated FIG. 31 taken along line G-G.

As illustrated in FIG. 31 and FIG. 32, when viewed in the plan view from the +Z direction, the actuator (solenoid) 150 is disposed in the region 302 surrounded by the −X side end, the +X side end, the −Y side end, and the +Y side end of the carrier 121. The actuator 150 is, for example, a solenoid. One of the stator and the mover of the actuator 150 is connected to the side plate 124a of the carrier 121. Furthermore, the other one of the stator and the mover of the actuator 150 is connected to the third main surface 110a of the base 110.

The actuator 150 is connected to the side plate 124a of the carrier 121 via, for example, the adapter 312 made of metal. Furthermore, the actuator 150 is connected to the third main surface 110a of the base 110 via, for example, the adapter 314 made of metal.

As illustrated in FIG. 31 and FIG. 32, the elastic members 316 are disposed, for example, between the side plate 114a of the base 110 and the side plate 124a of the carrier 121, between the side plate 114b of the base 110 and the side plate 124b of the carrier 121, between the side plate 114c of the base 110 and the side plate 124c of the carrier 121, and between the side plate 114d of the base 110 and the side plate 124d of the carrier 121, respectively. Furthermore, the elastic members 318 are disposed, for example, between the third main surface 110a of the base 110 and the side plate 124a of the carrier 121, between the third main surface 110a of the base 110 and the side plate 124b of the carrier 121, between the third main surface 110a of the base 110 and the side plate 124c of the carrier 121, and between the third main surface 110a of the base 110 and the side plate 124d of the carrier 121, respectively. The elastic members 316 and 318 return the movable part 120 displaced by the actuator 150 to a position before the displacement by elastic force. The elastic members 316 and 318 are each synthetic rubber, a spring, or the like.

In a case where the tactile presentation device 100 includes one actuator 150, when viewed in the plan view from the +Z direction, the actuator 150 is located on the symmetry axis M parallel to the X-axis direction of the movable part 120 as illustrated in FIG. 31. Furthermore, in a case where the tactile presentation device 100 includes two actuators 150 and the two actuators 150 have different outputs, when viewed in the plan view from the +Z direction, the actuators 150 are disposed at positions where the ratio of the vertical distance L6 between one actuator 150 and the symmetry axis M to the vertical distance L7 between the other actuator 150 and the symmetry axis M is the inverse ratio of the ratio of the output S1 of the one actuator 150 to the output S2 of the other actuator 150. Moreover, in a case where the tactile presentation device 100 includes a plurality of actuators 150 and the plurality of actuators 150 has the same output, when viewed in the plan view from the +Z direction, the plurality of actuators 150 is symmetrically disposed with the symmetry axis M. In these arrangements of the actuators 150, the sum of rotational moments with respect to the center of gravity P of the movable part 120 in the plane parallel to the first main surface 120a of the movable part 120 is zero.

Modification 3

In Modification 2, the actuator 150 is a solenoid. The actuator 150 may be a linear resonance actuator. The position of the actuator 150 is different between the configuration of a tactile presentation device 100 of the present modification and the configuration of the tactile presentation device 100 of Modification 2. The other configurations of the tactile presentation device 100 of the present modification are the same as those of Modification 2.

Figure 33:
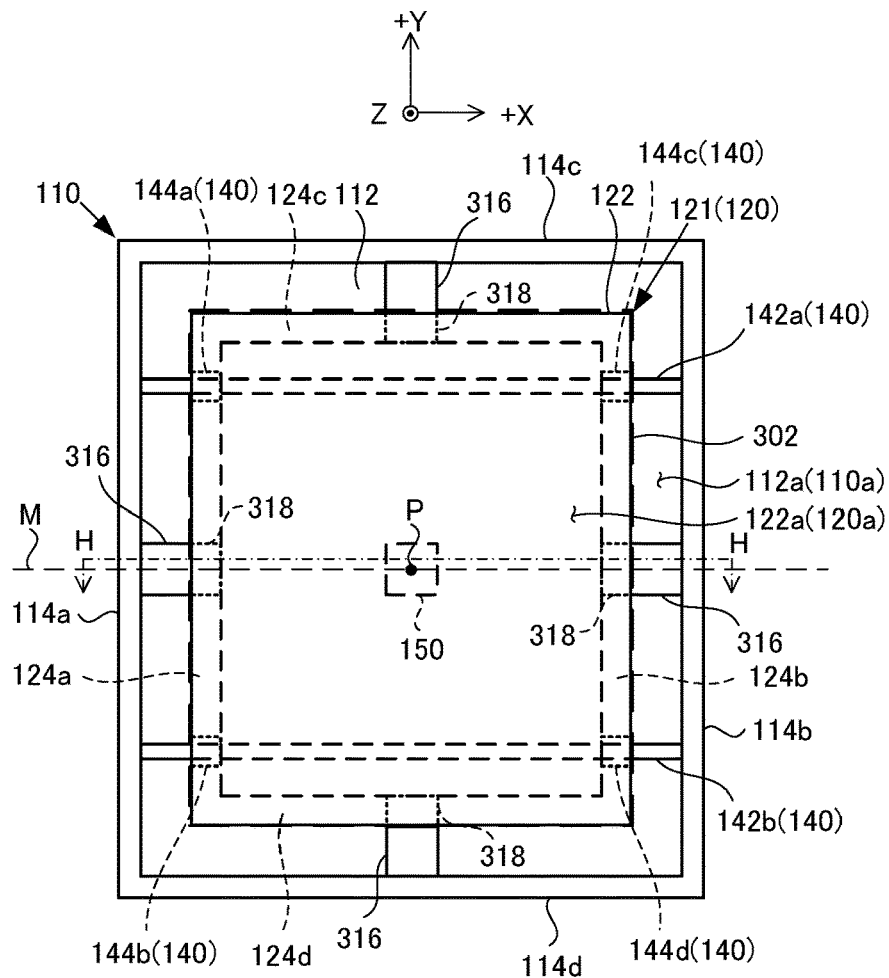
FIG. 33 is a plan view illustrating a tactile presentation device according to Modification 3.
Figure 34:
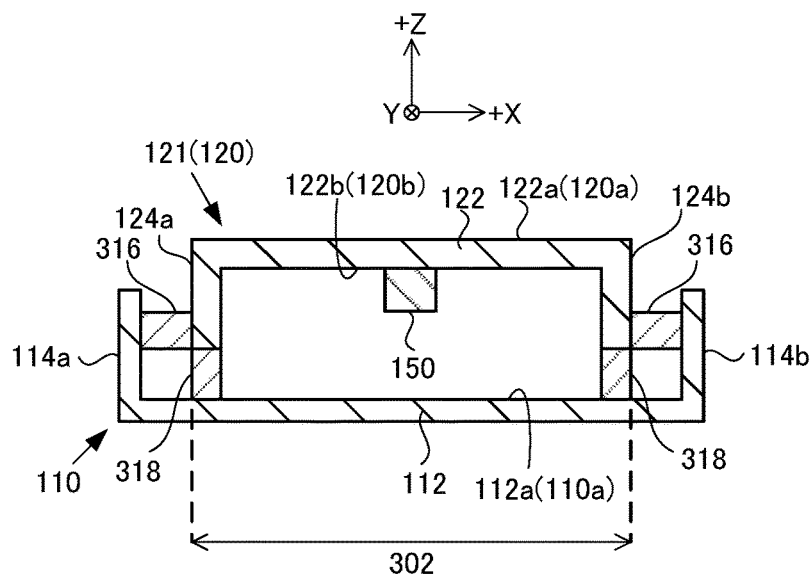
FIG. 34 is a cross-sectional view of the tactile presentation device illustrated FIG. 33 taken along line H-H.

As illustrated in FIG. 33 and FIG. 34, when viewed in the plan view from the +Z direction, the actuator (linear resonance actuator) 150 is provided on, for example, the second main surface 122b of the carrier 121 (second main surface 120b of the movable part 120) in the region 302 surrounded by the −X side end, the +X side end, the −Y side end, and the +Y side end of the carrier 121.

In a case where the tactile presentation device 100 includes one actuator 150, when viewed in the plan view from the +Z direction, the actuator 150 is located on the symmetry axis M parallel to the X-axis direction of the movable part 120 as illustrated in FIG. 33. Furthermore, in a case where the tactile presentation device 100 includes two actuators 150 and the two actuators 150 have different outputs, when viewed in the plan view from the +Z direction, the actuators 150 are disposed at positions where the ratio of the vertical distance L6 between one actuator 150 and the symmetry axis M to the vertical distance L7 between the other actuator 150 and the symmetry axis M is the inverse ratio of the ratio of the output S1 of the one actuator 150 to the output S2 of the other actuator 150. Moreover, in a case where the tactile presentation device 100 includes a plurality of actuators 150 and the plurality of actuators 150 has the same output, when viewed in the plan view from the +Z direction, the plurality of actuators 150 is symmetrically disposed with the symmetry axis M. In these arrangements of the actuators 150, the sum of rotational moments with respect to the center of gravity P of the movable part 120 in the plane parallel to the first main surface 120a of the movable part 120 is zero.

Modification 4

In Embodiment 1, the movable part 120 includes the carrier 121, the display 130, and the touch panel 131. The movable part 120 may also include only the display 130. For example, U-shaped bearings 204 may be provided on a case 322 of the display 130, and the case 322 of the display 130 may have the function of the carrier 121. The configuration of the movable part 120 is different between the configuration of a tactile presentation device 100 of the present modification and the configurations of the tactile presentation devices 100 of Embodiment 1, Modification 1, and the like. The other configurations of the tactile presentation device 100 of the present modification are the same as those of Embodiment 1, Modification 1, and the like.

Figure 35:
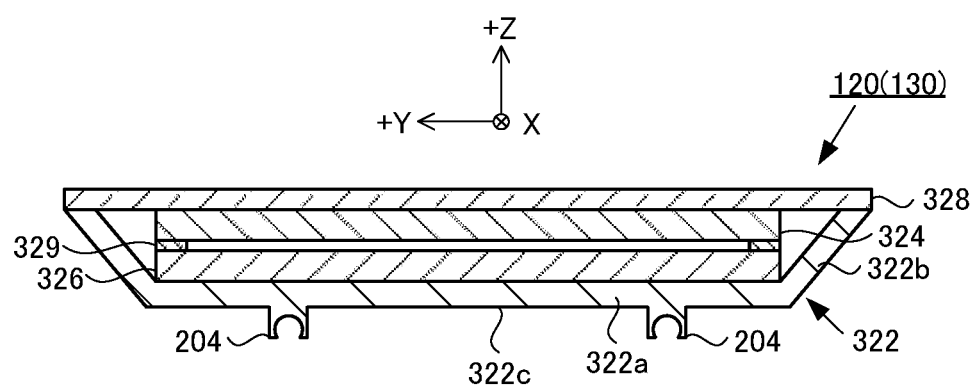
FIG. 35 is a schematic view illustrating the cross-section of a movable part according to Modification 4.

In the present modification, as illustrated in FIG. 35, the movable part 120 is the display 130 including a transmissive liquid crystal display panel 324, a backlight 326, the case 322, and a protective cover 328. The transmissive liquid crystal display panel 324 modulates light from the backlight 326 and displays characters, images, or the like. The backlight 326 irradiates the transmissive liquid crystal display panel 324 with light. The backlight 326 is a direct-type backlight including, for example, a white light emitting diode (LED), a reflective sheet, or the like. The backlight 326 is fixed to a bottom plate 322a of the case 322. The backlight 326 and the transmissive liquid crystal display panel 324 are fixed by a gasket 329. The case 322 accommodates the transmissive liquid crystal display panel 324 and the backlight 326. The protective cover 328 is provided on a side plate 322b of the case 322 to protect the transmissive liquid crystal display panel 324. The protective cover 328 is made of, for example, glass.

The case 322 has a box shape with the +Z side open. The case 322 is formed by, for example, aluminum die casting. The case 322 includes four U-shaped bearings 204 on a main surface 322c of the bottom plate 322a facing the third main surface 110a of the base 110. Each of the shafts 142a and 142b provided on the base 110 are inserted into each of the U-shaped bearings 204. The U-shaped bearings 204 and the shafts 142a and 142b connect the base 110 and the display 130 (movable part 120), and form the guider 140 that regulates the displacement direction of the display 130 (movable part 120) in the X-axis direction by sliding in the X-axis direction. The main surface 322c of the bottom plate 322a of the case 322 corresponds to the second main surface 120b of the movable part 120.

In the present modification, the guider 140 including the shafts 142a and 142b connects the display 130 (movable part 120) and the base 110, so that it is possible to increase the strength against the touch of the user. The guider 140 supports the display 130 from the main surface 322c (second main surface 120b of the movable part 120) side of the case 322, so that it is possible to further increase the strength against the touch of the user. Furthermore, the guider 140 regulates the displacement direction of the display 130 in the X-axis direction, so that the tactile presentation device 100 of the present modification can restrain the displacement of the display 130 in directions other than the X-axis direction, and convert force generated by the actuator 150 into the displacement (vibration) of the display 130 in the X-axis direction with high efficiency. Consequently, the tactile presentation device 100 of the present modification can strongly vibrate the display 130. Moreover, similarly to the tactile presentation device 100 of Embodiment 1, the actuator 150 is located on the symmetry axis M of the display 130 (movable part 120) parallel to the X-axis direction, thereby converting generated force into the displacement (vibration) of the display 130 in the X-axis direction with high efficiency. Consequently, the tactile presentation device 100 of the present modification can strongly vibrate the display 130, thereby giving strong vibration to the user.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A tactile presentation device comprising:
a movable part that has a first main surface and presents tactile to a user by being displaced in a predetermined one axial direction parallel to the first main surface;
a base that supports the movable part in a displaceable manner;
a guider that connects the base and the movable part, and regulates a displacement direction of the movable part in the one axial direction by sliding in the one axial direction; and
one or more actuators that displace the movable part in the one axial direction from one end side of the movable part in the one axial direction, wherein
when the number of actuators is one, the actuator is located on a symmetry axis of the movable part parallel to the one axial direction,
when the number of actuators is two and the two actuators have different outputs, the two actuators are disposed at positions, where a ratio of a vertical distance between one of the actuators and the symmetry axis to a vertical distance between a remaining one of the actuators and the symmetry axis is an inverse ratio of a ratio of output of one of the actuators to output of the remaining one of the actuators, with the symmetry axis interposed between the two actuators, and
when the number of actuators is two or more and the two or more actuators have a same output, the plurality of the actuators is located symmetrically with respect to the symmetry axis.

2. The tactile presentation device according to claim 1, wherein the guider includes a shaft provided on one of the base and the movable part and extending in the one axial direction and a bearing provided on a remaining one of the base and the movable part, the shaft being inserted into the bearing.

3. A tactile presentation device comprising:
a movable part that has a first main surface and presents tactile to a user by being displaced in a predetermined one axial direction parallel to the first main surface;
a base that supports the movable part in a displaceable manner;
a bush part including a rubber bush provided in the movable part or the base and a shaft portion inserted into the rubber bush to connect the movable part and the base; and
one or more actuators that displace the movable part in the one axial direction from one end side of the movable part in the one axial direction, wherein
when the number of actuators is one, the actuator is located on a symmetry axis of the movable part parallel to the one axial direction,
when the number of actuators is two and the two actuators have different outputs, the two actuators are disposed at positions, where a ratio of a vertical distance between one of the actuators and the symmetry axis to a vertical distance between a remaining one of the actuators and the symmetry axis is an inverse ratio of a ratio of output of one of the actuators to output of the remaining one of the actuators, with the symmetry axis interposed between the two actuators, and when the number of actuators is two or more and the two or more actuators have a same output, the plurality of the actuators is located symmetrically with respect to the symmetry axis.

4. The tactile presentation device according to claim 1, wherein the symmetry axis passes through the center of gravity of the movable part.

5. The tactile presentation device according to claim 1, wherein the symmetry axis divides the first main surface of the movable part into two equal parts when the first main surface of the movable part is viewed in a plan view.

6. The tactile presentation device according to claim 1, wherein a sum of rotational moments with respect to the center of gravity of the movable part in a plane parallel to the first main surface of the movable part is zero.

7. The tactile presentation device according to claim 1, wherein the movable part includes a carrier connected to the base, a display disposed on the carrier to display a character or an image, and a touch panel disposed on the display to receive an instruction of a user.

8. The tactile presentation device according to claim 1, wherein the movable part includes a display connected to the base to display a character or an image, and a touch panel disposed on the display to receive an instruction of a user.

9. The tactile presentation device according to claim 1, wherein the movable part is a display that displays a character or an image.

10. The tactile presentation device according to claim 3, wherein the symmetry axis passes through the center of gravity of the movable part.

11. The tactile presentation device according to claim 3, wherein the symmetry axis divides the first main surface of the movable part into two equal parts when the first main surface of the movable part is viewed in a plan view.

12. The tactile presentation device according to claim 3, wherein a sum of rotational moments with respect to the center of gravity of the movable part in a plane parallel to the first main surface of the movable part is zero.

13. The tactile presentation device according to claim 3, wherein the movable part includes a carrier connected to the base, a display disposed on the carrier to display a character or an image, and a touch panel disposed on the display to receive an instruction of a user.

14. The tactile presentation device according to claim 3, wherein the movable part includes a display connected to the base to display a character or an image, and a touch panel disposed on the display to receive an instruction of a user.

15. The tactile presentation device according to claim 3, wherein the movable part is a display that displays a character or an image.

* * * * *